(12) United States Patent
Kono

(10) Patent No.: US 6,850,049 B2
(45) Date of Patent: Feb. 1, 2005

(54) SEMICONDUCTOR DEVICE INCLUDING VOLTAGE CONVERSION CIRCUIT HAVING TEMPERATURE DEPENDENCY

(75) Inventor: Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/642,216

(22) Filed: Aug. 18, 2003

(65) Prior Publication Data

US 2004/0164377 A1 Aug. 26, 2004

(30) Foreign Application Priority Data

Feb. 26, 2003 (JP) ....................................... 2003-049294

(51) Int. Cl.[7] .............................................. G05F 3/16
(52) U.S. Cl. ...................................... 323/315; 330/256
(58) Field of Search ......................... 323/315; 330/256, 330/275, 288

(56) References Cited

FOREIGN PATENT DOCUMENTS

JP         09-204773        8/1997

OTHER PUBLICATIONS

U.S. Appln. Ser. No. 10/336,793, filed Jan. 6, 2003.

*Primary Examiner*—Eddie Lee
*Assistant Examiner*—Douglas W. Owens
(74) *Attorney, Agent, or Firm*—McDermott Will & Emery LLP

(57) ABSTRACT

A semiconductor device according to the present invention has a configuration that a resistance section is connected to only one of a current-mirror section forming a voltage conversion circuit and an output section. With this configuration, it is possible to determine the temperature dependency of an output voltage according to S factors of transistors forming one of the current-mirror section and the output section and a resistance value of the resistance section, and to suppress manufacturing irregularities caused by irregularities of the transistors between the two sections and those among a plurality of resistance materials.

20 Claims, 13 Drawing Sheets

VOLTAGE SOURCE CIRCUIT 2

CONSTANT VOLTAGE SOURCE CIRCUIT 5

OUTPUT VOLTAGE GENERATION CIRCUIT 6

$Itmr = (WRo/WLo) \times IR2$
$Ic \propto Itmr$

BASIC RING OSCILLATOR 3

SEMICONDUCTOR DEVICE INCLUDING VOLTAGE CONVERSION CIRCUIT HAVING TEMPERATURE DEPENDENCY

BACKGROUND OF THE INVENTION

1. Field of the Invention

The present invention relates to a semiconductor device including a voltage conversion circuit which converts the voltage value of an input voltage according to the change of the resistance value of a resistance section provided in a circuit as temperature changes and which outputs an output voltage.

2. Description of the Background Art

Recently, as a portable device such as a cellular phone and a PDA (Personal Digital Assistant) spread widely, the quantities of information processed by these devices rapidly increase. Therefore, the capacity of a work memory is greatly increased and a DRAM (Dynamic Random Access Memory) cell-based semiconductor memory is mainly employed as the work memory.

For the portable device driven by a battery, however, the increase of standby current due to a refresh operation which is essential to the DRAM cell is considerably problematic.

Meanwhile, the data holding time of a DRAM cell is greatly influenced by operating temperature. As the operating temperature rises, the data holding time is shortened. It is therefore desirable to change the refresh interval of the DRAM cell as well as the temperature thereof so as to conform to this characteristic.

Specifically, by controlling the refresh interval to become wider as temperature is lower, the refresh operation current of the DRAM cell at a temperature near a room temperature, at which the portable device is normally used, is lowered and the current consumption of the portable device in a standby state is decreased.

Japanese Patent Laying-Open No. 9-204773 discloses a method for adjusting a current carried to a ring oscillator which serves as an oscillation circuit for setting a refresh interval according to temperature.

Conventionally, a voltage conversion circuit which supplies a constant voltage to the gate electrode of a transistor in the next stage so that the transistor in the next stage can carry a constant current, i.e., a circuit (hereinafter, referred to as "voltage conversion circuit") which functionally converts the voltage value of an input voltage into a different voltage value and which outputs an output voltage has temperature dependency and changes the output voltage.

A current carried to the ring oscillator changes according to the change of this output voltage and the oscillation frequency of the ring oscillator changes, accordingly.

However, it is known that the temperature dependency of the voltage conversion circuit disadvantageously becomes irregular due to the manufacturing irregularities such as the manufacturing irregularity of the resistance value of the resistance connected between a MOS transistor and a power supply voltage line.

The irregular temperature dependency does not always occur in the same manner per wafer or per chip in a wafer plane.

SUMMARY OF THE INVENTION

The present invention has been achieved to solve the conventional disadvantages. It is an object of the present invention to suppress a voltage conversion circuit having temperature dependency from being influenced by manufacturing irregularities.

It is another object of the present invention to attain a voltage conversion circuit having temperature dependency according to an irregularity limitation requirement.

A semiconductor device according to an aspect of the present invention includes a voltage conversion circuit for converting a voltage value of an input voltage according to temperature change and outputting an output voltage, wherein the voltage conversion circuit includes: an input section having a first transistor connected between a first voltage line and a first node, and carrying an input current by applying the input voltage to the first transistor; a current-mirror section having a second transistor connected between the first node and a second voltage line supplying a different voltage from a voltage supplied by the first voltage line, and a third transistor connected between a second node, to which an output current according to the input current is carried, and the second voltage line, and forming a current-mirror by the second and third transistors; an output section having a fourth transistor connected between the second node and the first voltage line, and outputting the output voltage according to the output current from the second node; and a resistance section connected only one of between the second voltage line and the second transistor and between the first voltage line and the fourth transistor, and provided only as a resistance element in said voltage conversion cicruit.

According to the present invention, as described above, the resistance section of the voltage conversion circuit is connected between the second transistor connected to the node through which the input current flows and the second voltage line or between the fourth transistor connected to the node through which the output current flows and the first voltage line and the other resistance sections are not provided. It is therefore possible to determine the characteristic of converting an input voltage into an output voltage according to temperature change by the resistance value of the resistance section and the second transistor or by the resistance value of the resistance section and the fourth transistor, and suppress the influence of manufacturing irregularities between the second and fourth transistors.

A semiconductor device according to another aspect of the present invention includes a plurality of voltage conversion circuits each outputting an output voltage according to an input voltage, wherein each of the voltage conversion circuits includes: an input section connected to a first voltage line, receiving the input voltage, and carrying an input current; a current-mirror section connected to a second voltage line supplying a different voltage from a voltage supplied by the first voltage line, and supplying an output current according to the input current; an output section connected to the first voltage line, and outputting the output voltage according to the output current; and a resistance section connected one of between the current-mirror section and the second voltage line and between the output section and the first voltage line, the plurality of voltage conversion circuits are cascaded to each other to form a plurality of voltage conversion circuit stages, and circuits elements forming the voltage conversion circuits are equal in connection relationship among the stages and the output voltage of each voltage conversion circuit stage rise or fall according to temperature rise.

According to another invention, the voltage conversion circuits equal in the connection relationship of circuit elements are cascaded to each other to form voltage conversion circuit stages, and each stage includes a resistance section having a positive or negative temperature characteristic. It is therefore possible to eliminate irregularities caused by the difference in the connection relationship of circuit elements between the stages and to attain greater temperature characteristics as a whole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Although the present inventor has conventionally known that characteristic irregularities generate to a voltage conversion circuit, appropriate analysis has not been performed as to which part greatly influences the irregularities and how to suppress the irregularities not by a manufacturing method but by the circuit arrangement of the voltage conversion circuit.

Figure 26:
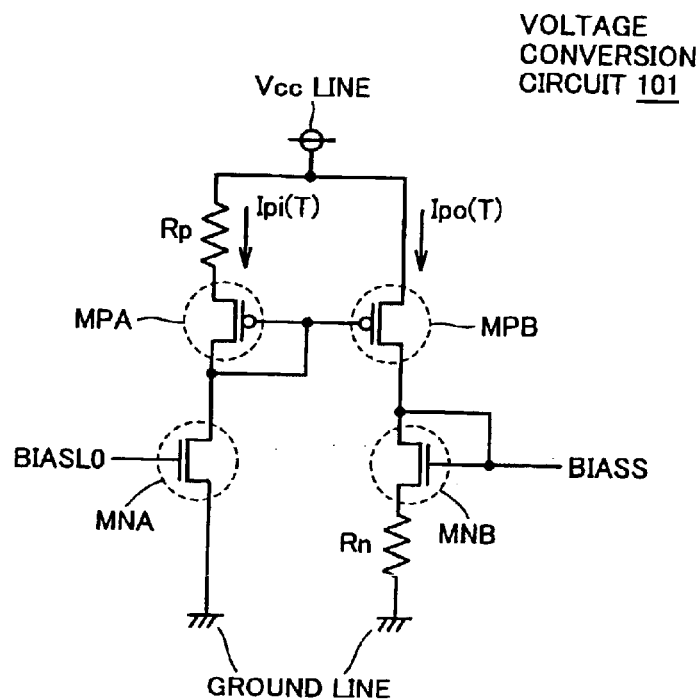
FIG. 26 is a circuit diagram of a voltage conversion circuit as a reference example.

FIG. 26 is a voltage conversion circuit 101 which has been previously studied by the applicant as a reference example.

Voltage conversion circuit 101 is characterized by obtaining large temperature change characteristics by employing two resistances Rp and Rn.

However, the following matters have been discovered as a result of the present analysis.

As resistance Rp connected to the source of a P-type MOS transistor MPA and resistance Rn connected to the source of an N-type MOS transistor MNB, resistances made of different materials are employed in view of the facilitation of connection and the like.

However, the irregularities of resistance values between the different materials tend to increase.

It has been further discovered that the temperature change element of an input current Ipi side is the S factors of P-type MOS transistors and that of an output current Ipo side is the S factors of N-type MOS transistors and that the irregularities of the S factors between the N-type and P-type MOS transistors generate.

In the following embodiments, discovered circuits that suppress irregularities in view of the above respects will be described.

First Embodiment

Figure 1:
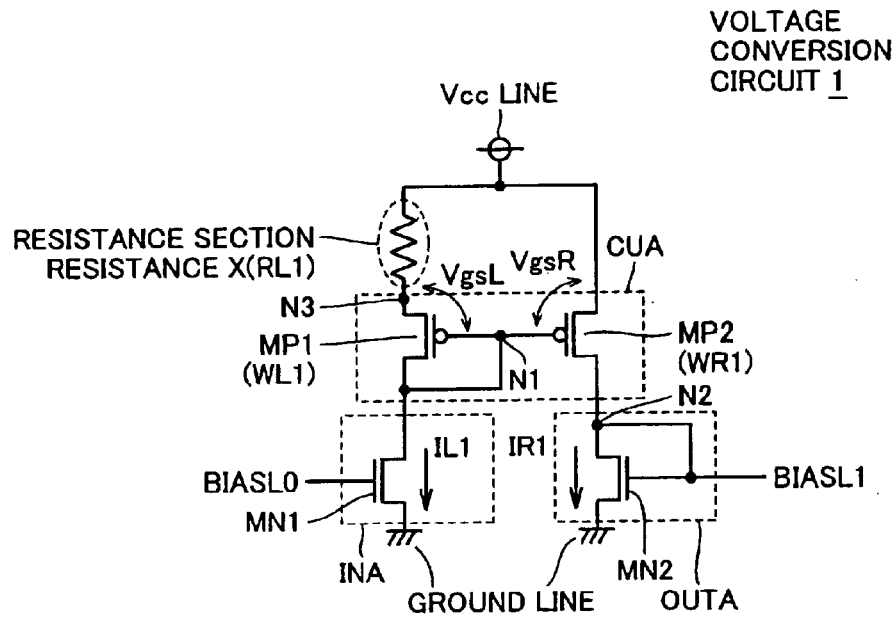
FIG. 1 is a circuit diagram of a voltage conversion circuit according to a first embodiment of the present invention.

In FIG. 1, a voltage conversion circuit according to a first embodiment is formed of an input section INA which is connected to a ground line serving as the first voltage line and to which an input voltage BIASL0 of voltage conversion circuit 1 is inputted, an output section OUTA which is connected to a ground line and which outputs an output voltage BIASL1 of voltage conversion circuit 1 according to input voltage BIASL0, a current-mirror section CUA which is connected to a Vcc line serving as the second voltage line and which changes an output current IR1 carried to output section OUTA according to an input current IL1 that is carried to input section INA according to input voltage BIASL0, and a resistance section which is connected between the Vcc line and current-mirror section CUA.

It is noted that output current IR1 and output voltage BIASL1 change as the resistance value of the resistance section changes according to temperature change.

In addition, when the changes of input and output currents are described, it is assumed that input and output voltages change according to the changes of the input and output currents, respectively. Conversely, when the changes of input and output voltages are described, it is assumed that input and output currents change according to the changes of the input and output voltages, respectively.

Next, the configuration of voltage conversion circuit 1 in the first embodiment will be described in detail.

In FIG. 1, in an N-type MOS transistor MN1 which forms input section INA serving as the first transistor, a drain serving as one of conductive ends is connected to a first node N1, a gate serving as a control terminal is connected to a node that inputs voltage conversion input voltage BIASL0, and a source serving as the other conductive end is connected to the ground line.

Current-mirror section CUA is formed of a P-type MOS transistor MP1 which serves as the second transistor and which is connected to first node N1 on an input current IL1 path, and a P-type MOS transistor MP2 which serves as the third transistor and which supplies output current IR1 to a second node N2.

In P-type MOS transistor MP1, a source serving as one of conductive ends is connected to a third node N3, and a gate serving as a control end and a drain serving as the other conductive end are connected to first node N1.

In P-type MOS transistor MP2, a source serving as one of conductive ends is connected to the Vcc line, a gate serving as a control end is connected to first node N1, and a drain serving as the other conductive end is connected to second node N2 of voltage conversion circuit 1.

In an N-type MOS transistor MN2 which serves as the fourth transistor forming output section OUTA, a drain serving as one conductive end and a gate serving as a control end are connected to second node N2 from which output voltage BIASL1 is outputted, and a source serving as the other conductive end is connected to the ground line.

Finally, the resistance section is a resistance X in FIG. 1 and connected between the Vcc line and third node N3, i.e., between the Vcc line and current-mirror section CUA.

Voltage conversion circuit 1 is characterized in that resistance X which is the resistance section is provided only between third node N3 and the Vcc line and that no resistances are provided in the other parts of voltage conversion circuit 1.

In addition, a voltage applied to resistance X is, for example, at least not less than 1/20 times as high as a voltage indicated by the S factor of P-type MOS transistor MP1.

Since the S factor is normally between 60 mV/decade and 100 mV/decade, the voltage applied to resistance X is not less than 3 mV.

In other words, when input current IL1 is set at, for example, 1 $\mu$A, the resistance value of resistance X is about not less than 3 $\Omega$.

Therefore, the resistance of the resistance section described in this embodiment is provided besides an ordinary parasitic resistance caused by an active region or contacts and applied to the source, drain or the like.

Further, the resistance value of resistance X changes according to temperature change. Depending on purposes, a resistance material having a positive temperature characteristic that the resistance value rises as the temperature rises or a resistance material having a negative temperature characteristic that the resistance value falls as the temperature rises is selected as the material of resistance X.

Specifically, as the resistance material having the positive temperature characteristic, n-type polysilicon, an n-type diffused layer, a p-type diffused layer or the like can be used. When the temperature rises from a room temperature to 70 to 80° C., the resistance values of the n-type polysilicon, the n-type diffused layer and the p-type diffused layer rise by about 2 to 4%, 8 to 12% and 8 to 12%, respectively.

As the resistance material having the negative temperature characteristic, impurity-undoped silicon, germanium or the like can be used.

The operation of voltage conversion circuit 1 will next be described.

It is assumed herein that P-type MOS transistors MP1 and MP2 operate in a sub-threshold region. Therefore, even with a small change in the voltage between the source and gate of each P-type MOS transistor, a current carried thereto greatly changes.

In voltage conversion circuit 1, as the resistance value of resistance X changes according to temperature, the voltage VgsL between the gate and the source of P-type MOS transistor MP1 shown in FIG. 1 (gate-source voltage VgsL) changes.

Accordingly, the gate-source voltage VgsR of P-type MOS transistor MP2 changes, and output current IR1 and output voltage BIASL1 are determined.

More specifically, in the resistance section which has the positive temperature characteristic, when temperature rises, then the resistance value of the resistance section rises, gate-source voltage VgsR of P-type MOS transistor MP2 rises, output current IR1 increases and output voltage BIASL1 rises.

In the resistance section which has the negative temperature characteristic, when temperature rises, then the resistance value of the resistance section falls, gate-source voltage VgsR of P-type MOS transistor MP2 falls, output current IR1 lowers and output voltage BIASL1 falls.

That is, in voltage conversion circuit 1, when input voltage BIASL0 is constant, the change of output voltage BIASL0 according to temperature is determined by the resistance value of resistance X and the characteristics of P-type MOS transistors MP1 and MP2 in the sub-threshold region. Therefore, voltage conversion circuit 1 is superior to the voltage conversion circuit shown in FIG. 26 in which the resistances are provided in the source of the P-type MOS transistor and the source of the N-type MOS transistor, respectively, in that the influence of the irregularities of the S factors between the two MOS transistors is eliminated.

Furthermore, since one resistance and one resistance material are employed, the problem of irregularities between resistance materials does not arise.

The above-described qualification will next be described using mathematical expressions.

To be specific, expressions are obtained based on the relationship between input current IL1 and output current IR1.

It is assumed herein that the channel widths of P-type MOS transistors MP1 and MP2 are WL1 and WR1 (WL1>WR1), respectively.

It is also assumed that the channel lengths of MP1 and MP2 are equal.

Based on the relationship between the gate-source voltages of MP1 and MP2 in FIG. 1, the following relational expression (1) is obtained.

$$VgsL(IL1)+IL1 \times RL1 = VgsR(IR1) \tag{1}$$

In expression (1), VgsL(IL1) indicates the gate-source voltage of MP1 when input current IL1 is carried, and VgsR(IR1) indicates the gate-source voltage of MP2 when output current IR1 is carried.

Figure 2:
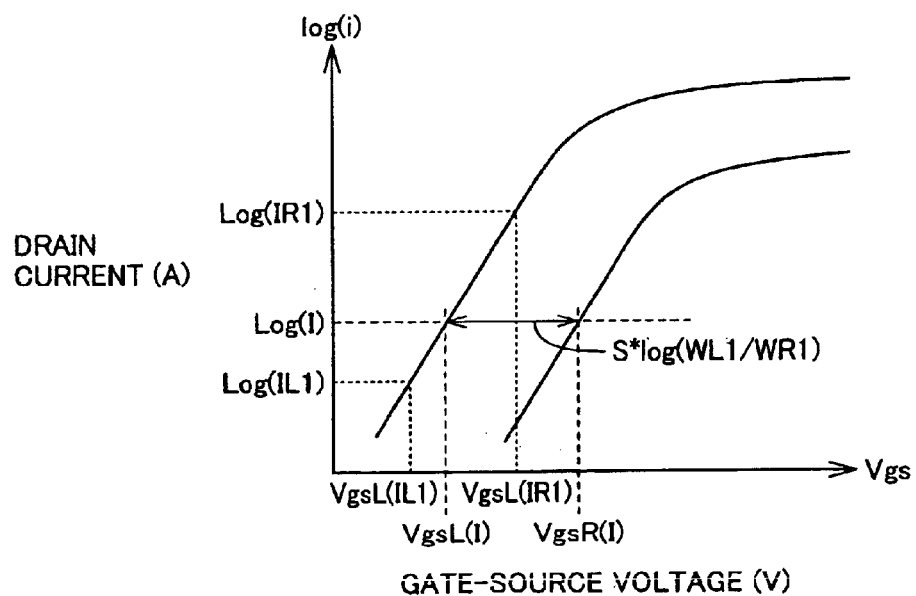
FIG. 2 shows characteristics of transistors according to the first embodiment of the present invention.

Referring to FIG. 2, the characteristics of MP1 and MP2 in the sub-threshold region will be described. In FIG. 2, the vertical axis indicates log(i) which is the common logarithm of the drain current I of an MOS transistor and the horizontal axis indicates a gate-source voltage Vgs.

It is assumed herein that the S factors of MP1 and MP2 are both S and that symbol I means an arbitrary current value in the sub-threshold region.

As is obvious from FIG. 2, at current I, the following relationship is satisfied.

$$VgsR(I) - VgsL(I) = S \times \log(WL1/WR1) \quad (2)$$

In addition, the following relationship is satisfied.

$$\log(IR1) - \log(IL1) = \{VgsL(IR1) - VgsL(IL1)\}/S \quad (3)$$

Next, when I=IR1 in expression (2) and expressions (1) to (3) are rearranged, then a relational expression (4) for the relationship between IL1 and IR1 is derived.

$$IR1 = (WR1/WL1) \times IL1 \times 10^{(IL1 \times RL1/S)} \quad (4)$$

Using expression (4), the temperature change quantity (temperature characteristic) IR1(Tb)/IR1(Ta)=ΔIR1 of input current IR1 as temperature changes from Ta to Tb is given as an expression (5).

$$\Delta IR1 = \Delta IL1 \times 10^{[\alpha \times \{1 - \Delta S/(\Delta IL1 \times \Delta RL1)\}]} \quad (5)$$

In expression (5), ΔIL1, ΔS and ΔRL1 represent temperature change quantities, i.e., ΔIL1=IL1(Tb)/IL1(Ta), ΔS=S(Tb)/S(Ta) and ΔRL1=RL1(Tb)/RL1(Ta), respectively.

In addition, a factor α (hereinafter, referred to as "amplification factor") satisfies the following expression.

$$\alpha = IL1(Tb) \times RL1(Tb)/S(Tb) \quad (6)$$

Amplification factor α is determined by a certain temperature of interest, i.e., temperature Tb, and the value of amplification factor α is obtained by dividing the voltage applied to the resistance by the S factor.

Based on expression (5), temperature change quantity ΔIR1 of output current IR1 of voltage conversion circuit 1 satisfies the following relationship with temperature change quantity ΔIL1 of input current IL1.

$$\Delta IR1/\Delta IL1 = 10^{[\alpha \times \{1 - \Delta S/(\Delta IL1 \times \Delta RL1)\}]} \quad (7)$$

From expression (7), the ratio of the temperature change of output current IR1 to the temperature change of input current IL1 can be obtained.

For example, when voltage conversion circuit 1 is used as the voltage conversion circuit of a refresh timer of DRAM, the output current of the voltage conversion circuit is desired to have a positive temperature characteristic, i.e., to have a characteristic that the output current rises as temperature rises. Therefore, it suffices to select the material of resistance X to satisfy ΔS/(ΔIL1×ΔRL1)<1 based on expression (7).

For example, when the material of resistance X is the well resistance of an N well and α=1, ΔIL1=1.1, ΔS=1.2 and ΔRL1=1.2, then ΔIR1/ΔIL1=1.23 and ΔIR1=1.36.

Thus, expression (7) demonstrates that the temperature change of the output current relative to the input current can be determined based on the temperature change of resistance X and the S factors of the P-type MOS transistors.

In expression (7), ΔS is the temperature change quantity in the P-type MOS transistor and is not influenced by the S factor of the other N-type MOS transistors. It is therefore possible to suppress the influence of the irregularities of the S factors between the P-type MOS transistors and the N-type MOS transistors.

Further, in the operation of voltage conversion circuit 1, it is only resistance X that is influenced by the temperature change, so that it is possible to suppress the influence of irregularities of resistances made of different materials.

Figure 3:
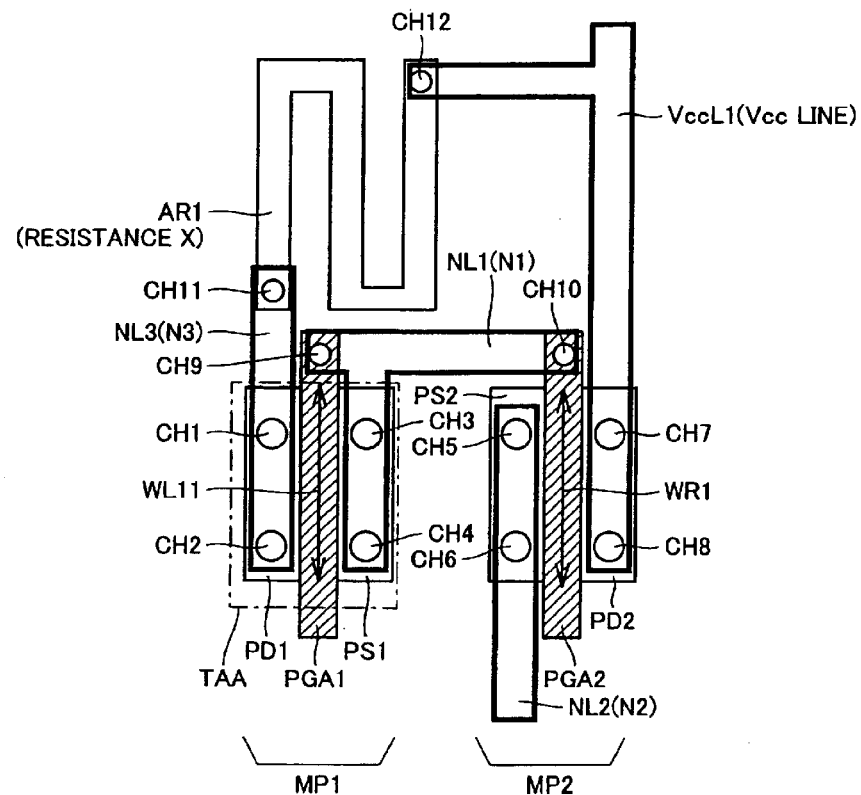
FIG. 3 is a pattern layout view of the voltage conversion circuit according to the first embodiment of the present invention.

FIG. 3 shows an example of the pattern layout of voltage conversion circuit 1 in this embodiment.

The pattern layout of FIG. 3 shows P-type MOS transistors MP1 and MP2, resistance X and the Vcc line shown in FIG. 1.

In FIG. 3, PD1 and PS1 denote a drain active region and a source active region of MP1 and PD2 and PS2 denote a drain active region and a source active region of MP2, respectively.

PGA1 and PGA2 denote gate electrodes of MP1 and MP2, respectively.

AR1 denotes a zigzag pattern forming resistance X, that is, the pattern of an active region forming the well resistance of an N well.

A wiring NL1 corresponds to node N1 and is connected to PS1, PGA1 and PGA2 through contacts CH3, CH4, CH9 and CH10.

A wiring NL2 corresponds to node N2 and is connected to PS2 through contacts CH5 and CH6.

A wiring NL3 corresponds to node N3 and is connected to PD1 and AR1 through contacts CH1, CH2 and CH11.

A wiring VccL1 is the Vcc line and connected to PD2 and AR1 through contacts CH7, CH8 and CH12.

As can be seen, Vcc line VccL1 is directly connected to PD2 which is the drain of P-type MOS transistor MP2 while Vcc line VccL1 is connected to PD1 which is the drain of P-type MOS transistor MP1 through AR1 which is resistance X.

FIG. 3 shows that channel widths WL11 and WR1 of P-type MOS transistors MP1 and MP2 are equal. As already described, when the channel width of P-type MOS transistor MP1 is set larger than that of P-type MOS transistor MP2, P-type MOS transistor MP1 may be constituted by arranging a plurality of transistor patterns TAA shown in FIG. 3 in parallel.

In that case, since the basic transistor pattern is the same, it is possible to set the characteristic of the transistor having a large channel width and that of the transistor having a small channel width equal.

Second Embodiment

In the second embodiment, a case where voltage conversion circuit 1 in the first embodiment is applied to a ring oscillator for the refresh timer of DRAM will be described.

Figure 4:
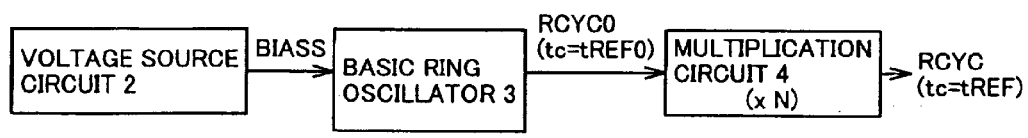
FIG. 4 is a block diagram of a voltage conversion circuit according to a second embodiment of the present invention.

Referring to FIG. 4, a basic ring oscillator 3 is controlled by an output voltage BIASS of a voltage source circuit 2, a transmission signal RCYC0 from basic ring oscillator 3 is multiplied by N by a multiplication circuit 4, and an oscillation frequency RCYC of the refresh timer is thereby determined.

Figure 5:
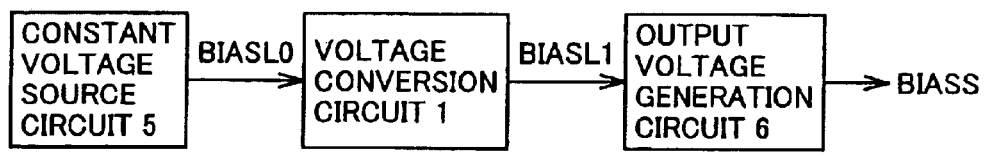
FIG. 5 is a block diagram of a voltage source circuit according to the second embodiment of the present invention.

Referring then to FIG. 5, voltage source circuit 2 includes a constant voltage source circuit 5, voltage conversion circuit 1 which inputs output voltage BIASL0 of constant voltage source circuit 5 and which is shown in the first embodiment, and an output voltage generation circuit 6 which inputs output voltage BIASL1 of voltage conversion circuit 1 and which outputs output voltage BIASS.

Figure 6:
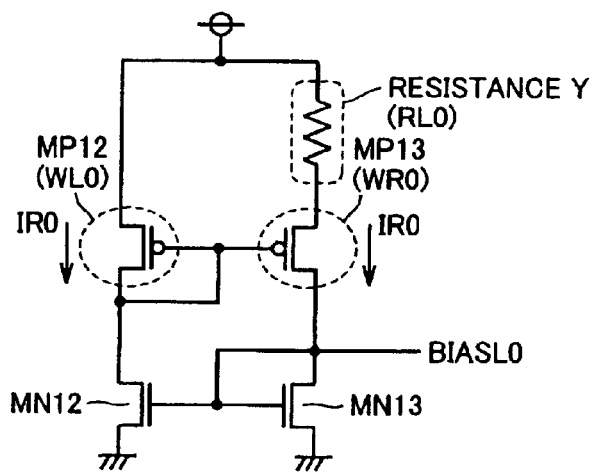
FIG. 6 is a circuit diagram of a constant voltage source circuit according to the second embodiment of the present invention.

Constant voltage source circuit 5 is, for example, one shown in FIG. 6 which is normally referred to as a "Weak Inversion type" constant voltage source circuit which includes P-type MOS transistors MP12 and MP13 forming a current-mirror and operating in a sub-threshold region.

Since N-type MOS transistors MN12 and MN13 included in circuit 5 also form a current-mirror, constant voltage source circuit 5 is a positive feedback circuit and outputs BIASL0.

Figure 7:
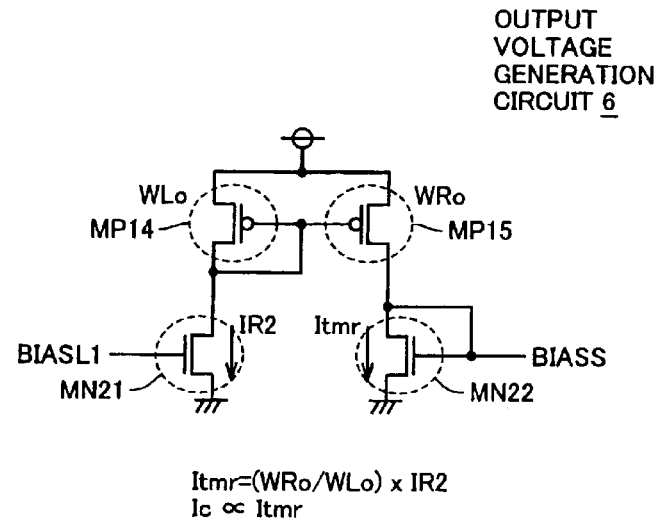
FIG. 7 is a circuit diagram of an output voltage generation circuit according to the second embodiment of the present invention.

Output voltage generation circuit 6 is, for example, one shown in FIG. 7. Output voltage generation circuit 6 amplifies current by as much as the size of a P-type MOS transistor MP15 twice as large as that of a P-type MOS transistor MP14 (the size of P-type MOS transistor MP15 is WR0/WL0 times as large as the size of transistor MP14 when gate lengths of MP14 and MP15 are equal and gate widths thereof are WR0 and WL0, respectively) and outputs the amplified current as a voltage.

That is, the level of input voltage BIASL1 inputted to the gate of an N-type MOS transistor MN21 is converted and the level-converted voltage is output as output voltage BIASS from an N-type MOS transistor MN22 so that the voltage level is suited for a circuit operation in the next stage.

Normally, the transistors of output voltage generation circuit 6 are expected to operate at a higher voltage than a threshold voltage.

Figure 8:
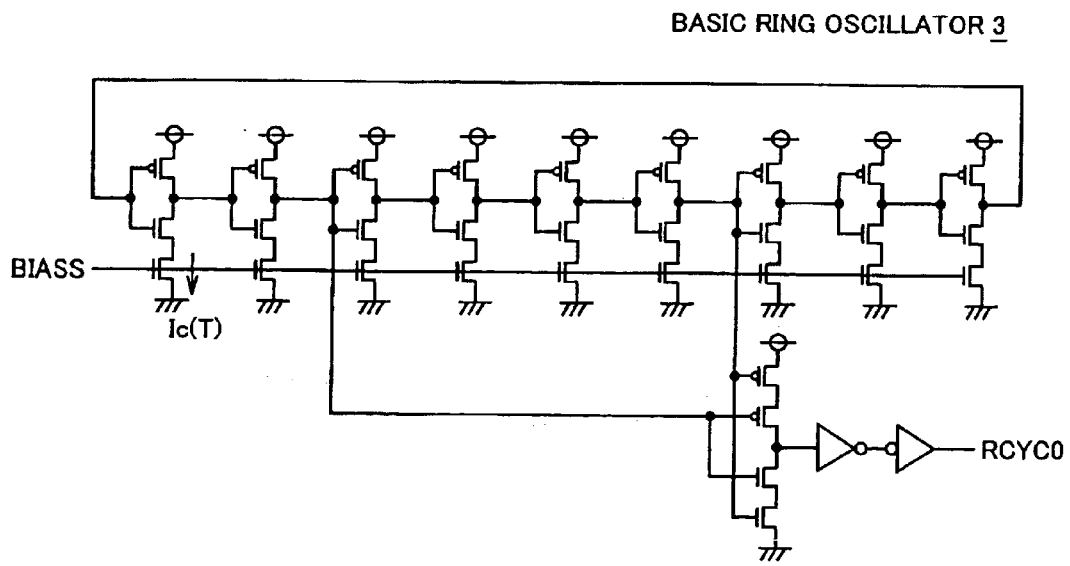
FIG. 8 is a circuit diagram of a basic ring oscillator according to the second embodiment of the present invention.

Referring to FIG. 8, basic ring oscillator 3 is basically formed of M (odd-numbered) inverters. An N-type MOS transistor which receives output voltage BIASS of voltage source circuit 2 is inserted into the pull-down side of each inverter, whereby charges are extracted from the output node of the inverter at a constant current Ic(T) mirrored from output voltage generation circuit 6.

In other words, the driving capability of each inverter is controlled according to the change of voltage conversion circuit 1 and the oscillation frequency of output RCYC0 of basic ring oscillator 3 is determined.

Moreover, through multiplication circuit 4, oscillation frequency RCYC of the refresh timer is determined.

As described above, by employing voltage conversion circuit 1 in the first embodiment, it is possible to realize the refresh timer less influenced by manufacturing irregularities and excellent in temperature dependency.

Third Embodiment

In the first and second embodiments, an example of the use of one voltage conversion circuit has been described. When the temperature dependency of the output voltage and output current of the voltage conversion circuit is to be increased but only the temperature change of one resistance X is utilized, the selection of the resistance material is limited by the restriction of manufacturing or the like. Therefore, the desired great temperature dependency cannot be sometimes attained.

Considering this, the third embodiment is intended to attain a voltage conversion circuit and a voltage source circuit capable of attaining greater temperature dependency.

Figure 9:
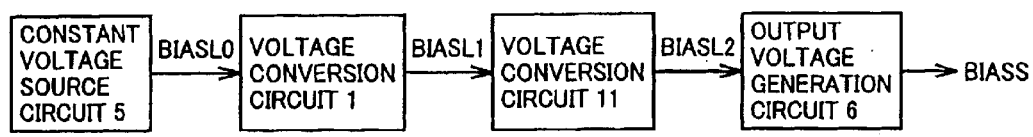
FIG. 9 is a block diagram of a voltage source circuit according to a third embodiment of the present invention.

Referring to FIG. 9, a voltage source circuit 21 according to the third embodiment is formed by cascading voltage conversion circuit 1 and a voltage conversion circuit 11 to thereby form voltage conversion circuit stages.

It is assumed herein that voltage conversion circuits 1 and 11 are equal to voltage conversion circuit 1 shown in FIG. 1.

By cascading voltage conversion circuits 1 and 11, two voltage conversion circuit stages are constituted, making it possible to attain a voltage conversion circuit having large temperature change even when one voltage conversion circuit stage cannot exhibit a sufficient temperature characteristic.

Next, voltage source circuit 21 will be described using mathematical expressions.

It is assumed that the input current of the second voltage conversion circuit stage is IL2, the output current thereof is IR2, the amplification factor thereof is $\beta$ and the resistance value thereof is RL2 and that IR1=IL2.

In this case, the following expression (8) is given as in the case of expression (5).

$$\Delta IR2 = \Delta IL2 \times 10^{[\beta \times \{1-\Delta S/(\Delta IL2 \times \Delta RL2)\}]} \qquad (8)$$

Further, when the relationship with the first stage is considered, expression (8) is transformed to the following expression (9).

$$\Delta IR2 = \Delta IR1 \times 10^{[\beta \times \{1-\Delta S/(\Delta IR1 \times \Delta RL2)\}]} \qquad (9)$$

Now, the change quantity of a current according to temperature change (temperature change quantity of a current) will be considered while taking concrete numeric values as an example. In case of the first voltage conversion circuit stage shown in the first embodiment, when $\alpha=1$, $\Delta IL1=1.1$ and $\Delta RL1=1.2$, $\Delta IR1=1.36$.

In this embodiment, by contrast, when $\beta=1$, $\Delta S=1.2$ and $\Delta RL2=1.2$, $\Delta IR2=2.50$.

As can be seen, while temperature change quantity $\Delta IR1$ of the output current of the first voltage conversion circuit stage is 1.36, temperature change quantity $\Delta IR2$ of the output current of the second voltage conversion circuit stage is 2.50, thus demonstrating that it is possible to increase the temperature change quantity of the output current.

Next, pattern layout will be described.

Figure 10:
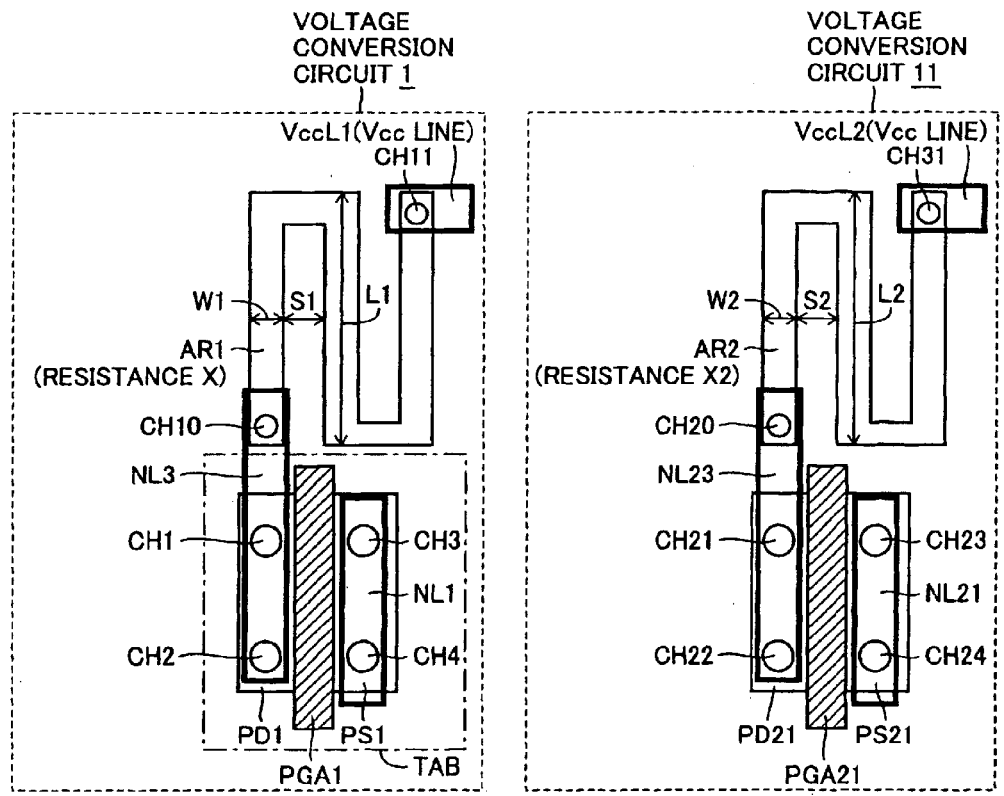
FIG. 10 is a pattern layout view of voltage conversion circuits according to the third embodiment of the present invention.

FIG. 10 shows the pattern of first stage of voltage conversion circuit 1 and that of the second stage of voltage conversion circuit 11.

The patterns of voltage conversion circuits 1 and 11 are equal to part of the pattern shown in FIG. 3.

In the pattern of voltage conversion circuit 11, PD21 and PS21 denote a drain active region and a source active region of a P-type MOS transistor and PGA21 denotes a gate electrode thereof.

AR2 denotes a zigzag pattern forming a resistance X2, i.e., the pattern of an active region forming the well resistance of an N well.

In order to increase the resistance value, the length of each pattern may be increased with the pattern width kept unchanged, i.e., a plurality of stages of zigzag patterns may be continuously provided.

A wiring NL21 is connected to PS21 through contacts CH23 and CH24.

A wiring NL23 is connected to PS21 and $\Delta R2$ through contacts CH21, CH22 and CH20.

Wiring VccL1 is the Vcc line and connected to $\Delta R2$ through contact CH31.

In FIG. 10, the transistors of voltage conversion circuits 1 and 11 are designed to be equal in pattern and resistance X of voltage conversion circuit 1 is designed to be equal to resistance X2 of voltage conversion circuit 11.

With this designing, it is possible to prevent generation of great irregularities even when manufacturing irregularities such as the irregularity of dimensions occur.

Further, since the resistances are particularly important elements, it is desirable that active region widths W1 and W2, lengths L1 and L2 of respective voltage conversion circuit stages are equal, respectively and active region distances S1 and S2 are equal in FIG. 10.

When some of them are to be set equal, it is most preferable to set the pattern widths, i.e., active region widths equal.

This is because the pattern widths are smaller than the other dimensions and considered to have the greatest irregularity, depending on manufacturing methods.

Nevertheless, a pattern having greater ordinality is more excellent in suppressing irregularities. It is therefore considered that the repetition of the same pattern can better suppress manufacturing irregularities.

Therefore, it is preferable to repeat the active region distances or pattern distances and the lengths of respective stages equally.

In an actual device, however, the pattern distances and lengths of the respective stages are not equal due to the restriction of patterns and manufacturing irregularities and it is considered that they vary by about 10%.

By setting the directions of the respective patterns equal between the circuits, it is possible to prevent the occurrence of the irregularities of resistance values due to the asymmetry of the active regions resulting from the ion injection angle.

In this embodiment, an example of cascading two voltage conversion circuit stages has been described. However, the number of stages is not limited to two but may be three or more.

Further, the resistance values of the respective voltage conversion circuits may be changed. In that case, it is preferable to change the lengths of resistance patterns (the number of zigzag pattern stages or the like) in the respective voltage conversion circuits while using the same resistance material and setting the pattern widths of the resistances equal.

It is thereby possible to change the output of each stage according to the resistance value while suppressing the temperature characteristic irregularities of the output voltages of the respective stages.

The voltage conversion circuits described in this embodiment are equal in the connection structures of the respective constituent elements of the respective stages. Therefore, the elements that determine the temperature change quantities of the output voltage and the output current are those shown in expressions (5) and (9).

That is, the temperature change quantities of the output voltage and output current are determined by input current IL1 of voltage conversion circuit 1 determined by output BIASL0 of constant voltage source circuit 5 and temperature change quantities $\Delta RL1$ and $\Delta RL2$ of the resistance values and the S factors of the P-type MOS transistors.

In this embodiment, as for the S factors, only the S factors of the MOS transistors of one conductive type, i.e., the P-type MOS transistors may be considered and the influence of the process irregularities of the S factors between the N-type MOS transistors and the P-type MOS transistors can be suppressed.

As for the resistance values, by using the same resistance material for resistances RL1 and RL2, it is possible to eliminate the irregularity factors between the resistance materials and to suppress resistance irregularities.

The reasons that the resistance irregularities can be suppressed are considered as follows.

For example, when resistance materials A and B are used, the central resistance value of resistance material A and that of resistance B different from resistance material A are often shifted from expected values, respectively.

Therefore, when different resistance materials are used, great irregularities, to which the irregularities in materials and those between materials are added, sometimes generate.

When the same resistance material is used, the influence of the irregularity between the different materials can be eliminated.

By using a layout pattern common to the respective stages, it is possible to further suppress irregularities.

Conventionally, since irregularities increase as the number of circuits increases, it is not considered appropriate to increase the number of circuits.

However, as described in this embodiment, attention is paid to irregularities of the S factors and resistance materials between the MOS transistors among the irregularities, and the configuration of suppressing the irregularities is provided. With this structure, even when the number of circuits or stages increases, it is possible to suppress irregularities as a whole.

Further, as long as the requirements of the S factors and resistance materials are satisfied, it is considered that irregularities can be made within a certain range even when circuit configurations of the respective stages slightly differ.

As described above, according to the third embodiment, by cascading the voltage conversion circuits capable of suppressing the irregularities of S factors between the MOS transistors and the irregularities of resistances between the resistance materials, it is possible to attain great temperature characteristics while suppressing the manufacturing irregularities.

Further, according to the third embodiment, the temperature characteristics in a wide range can be realized according to the number of voltage conversion circuit stages. With this structure, BIASL0 that is the output of constant voltage circuit 5 shown in FIG. 5 and the input of voltage conversion circuit 1 is not required to have a large temperature change quantity.

Therefore, constant voltage source circuit 5 in this embodiment can also serve as a constant voltage circuit for an internal voltage generation circuit which generates the reference potential of a semiconductor device which does not require a large temperature change quantity. It can be thus expected to advantageously reduce layout area and decrease current consumption.

Since the constant voltage source circuit, in particular, is intended to suppress the irregularities among the chips as much as possible, the layout area of this circuit itself tends to be very large. Therefore, it is greatly advantageous to be able to use the constant voltage source circuit as outputs to a plurality of circuits.

Fourth Embodiment

In the third embodiment, a case of suppressing both the irregularities of S factors among the transistors and those of resistance materials among the resistance sections has been described.

In a fourth embodiment, a case where the irregularities are not so suppressed, as compared with the third embodiment has been described.

In this embodiment, it suffices to suppress either the irregularities of S factors among the transistors or those of resistance materials among the resistance sections.

When it suffices to suppress the irregularities of S factors among the transistors, the same configuration as that shown in FIGS. 9 and 10 may be considered. That is, one resistance section is provided in the same part of each stage and the first stage or voltage conversion circuit 1 and the second stage or voltage conversion circuit 11 use different materials for resistance X.

The configuration is advantageous in that pattern area can be reduced particularly when the resistance of the same resistance material cannot be used because of the layout limitation and the like.

When it suffices to suppress the irregularities of resistance materials among the resistance sections, voltage conversion circuits 101 shown in, for example, FIG. 26 may be cascaded.

In this case, the same resistance material is used for resistances Rp and Rn.

Further, even when the irregularities of S factors among the transistors and those of resistance materials among the resistance sections are both permitted, it is preferable that the equivalent circuits for cascaded voltage conversion circuits are equal among the respective stages.

Specifically, voltage conversion circuits 1 shown in FIG. 1 or voltage conversion circuits 101 shown in FIG. 26 may be cascaded.

When the equivalent circuits are equal in connection relationship of circuit constituent elements of the respective circuit stages, the tendencies of the irregularities become equal among the stages. Compared with a case of cascading circuits using equivalent circuits different among the stages, the irregularities can be made small and great temperature characteristics can be attained while suppressing the irregularities.

Further, by using a common pattern layout to the respective voltage conversion circuit stages, it is possible to suppress certain irregularities.

Moreover, as will be described later, by setting the resistance values of resistances Rp and Rn variable and adjustable, final irregularities may be suppressed.

It is preferable that the resistances employed in the respective stages have the same temperature characteristic, i.e., a positive temperature characteristic or a negative temperature characteristic.

When a voltage conversion circuit which includes a resistance having a positive temperature characteristic and a voltage conversion circuit which includes a resistance having a negative temperature characteristic are combined, for example, temperature that has risen is decreased, causing circuit pattern loss.

When a voltage conversion circuit which includes a resistance having a positive temperature characteristic and a voltage conversion circuit which includes a resistance having a negative temperature characteristic are combined, irregularities tend to increase and need to be suppressed.

As can be seen, according to the fourth embodiment, by setting at least the connection relationship of the circuit constituent elements of the respective voltage conversion circuit stages equal, it is possible to suppress irregularities which may be generated by the different connection relationship of the circuits. Even when a basic temperature change quantity per voltage conversion circuit stage is small, it is possible to eventually attain great temperature characteristics by cascading a plurality of such stages.

Further, by employing the resistance sections having the same positive or negative temperature characteristic in the respective stages, it is possible to attain voltage conversion circuits having good area efficiency and good temperature characteristics.

Fifth Embodiment

In the third and fourth embodiments, the configuration of cascading a plurality of voltage conversion circuits formed of the same constituent elements has been described.

When different resistance materials are used for resistances X, there is a high probability that the absolute values of the resistances change without any correlation among them.

Even when the same resistance material is employed in the respective stages, slight irregularities may possibly generate.

Further, there is a probability that output BIASL0 of constant voltage source circuit 5 differs from expected output.

For example, when the absolute values of IL1(Tb) and RL1(Tb) greatly differ from expected values at temperature Tb in the configuration shown in FIG. 1, amplification factor α represented by expression (6) greatly changes, with the result that the temperature change quantity of the output current determined by expression (5) also greatly changes.

Taking them into consideration, the fifth embodiment is intended to control the temperature change quantity by providing a mechanism which can adjust circuit parameters.

It is assumed herein that the expected value of amplification factor α is 1 (α=1) and that the ratio of the gate widths or mirror ratio of P-type MOS transistors MP3 and MP4 is WR1/WL1=1/10.

Under these conditions, IR1(Tb)=IL1(Tb) according to expressions (4) and (6).

Figure 11:
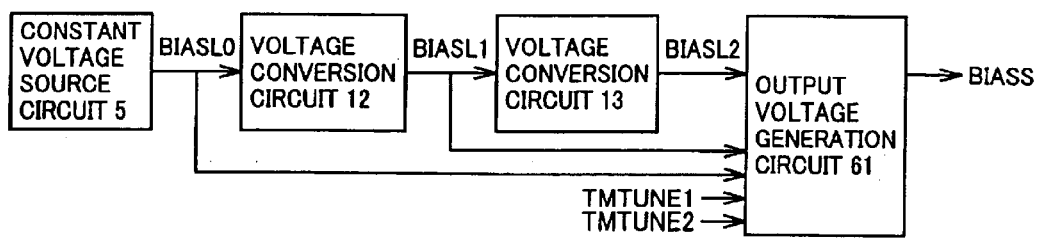
FIG. 11 is a block diagram of a voltage source circuit according to a fifth embodiment of the present invention.

FIG. 11 differs from FIG. 9 in that output BIASL0 of constant voltage source circuit 5 and output BIASL1 of the first stage of voltage conversion circuit 12 are both inputted to an output voltage generation circuit 61.

Figure 12:
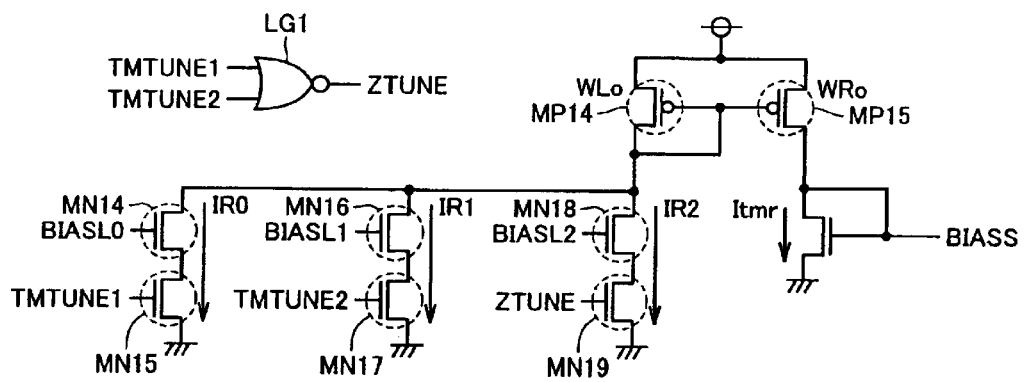
FIG. 12 is a circuit diagram of an output voltage generation circuit according to the fifth embodiment of the present invention.

Referring to FIG. 12, output voltage generation circuit 61 in this embodiment differs from output voltage generation circuit 6 shown in FIG. 7 in that N-type MOS transistors MN14 to MN19 shown in FIG. 12 are provided and currents IR0, IR1 and IR2 can be selectively carried according to adjustment test signals TMTUNE1 and TMTUNE2 which are select signals.

That is, in accordance with the adjustment test signals, one of the outputs of constant voltage source circuit 5, the first stage of voltage conversion circuit 12 and the second stage of voltage conversion circuit 13 shown in FIG. 11 is selected, and it is possible to check which output is selected from output BIASS of output voltage generation circuit 61.

In the normal operation, an output ZTUNE of logic circuit LG1 is "H"; therefore, IR2 is selected.

Figure 13:
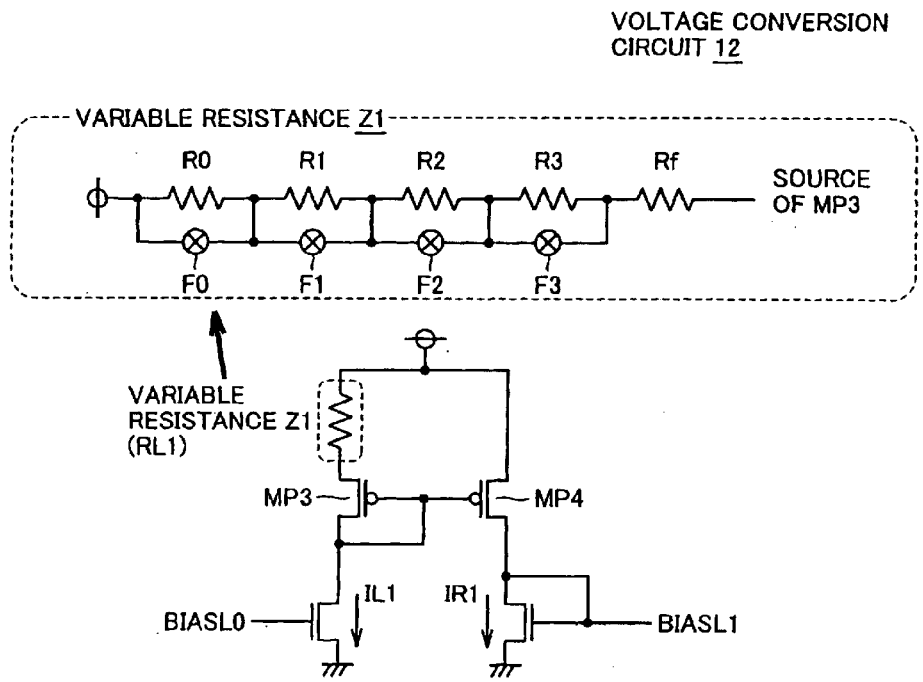
FIG. 13 is a circuit diagram of a voltage conversion circuit according to the fifth embodiment of the present invention.

Referring to FIG. 13, voltage conversion circuit 12 differs from voltage conversion circuit 1 shown in FIG. 1 in that the resistance of the resistance section changes from resistance X to a variable resistance Z1, an adjustment mechanism is provided and the resistance value of the resistance can be varied. It is noted that the detail of variable resistance Z1 serving as the resistance section is given as an enlarged view shown in the upper part of FIG. 13.

More specifically, variable resistance Z1 is formed of four adjustment resistances (resistance values R0 to R3) having fuse elements F0 to F3 arranged in parallel and one fixed resistance (resistance value Rf).

Resistance values R0 to R3 are different, e.g., R0=2×R1= 4×R2=8×R3. A final resistance value is determined by blowing the fuse elements F0 to F3 by laser trimming.

Alternatively, fuse elements F0 to F3 may be blown by a method other than the laser trimming.

In addition, voltage conversion circuit 13 shown in FIG. 11 is equal in configuration to voltage conversion circuit 1 shown in FIG. 1.

The resistance value adjustment sequence of voltage source circuit 22 in this embodiment will next be described.

The following two test modes for adjusting the temperature characteristic of voltage conversion circuit 12 are prepared and the resistance values are adjusted based on one of the test mode.

The first test mode is a test mode TM1 in which current IR0 of constant voltage source circuit 2 based on output BIASL0 of constant voltage source circuit 2 can be monitored. In FIG. 12, the first test mode is set by setting adjustment test signals TMTUNE1 at "H" and TMTUNE2 at "L".

The second test mode is a test mode TM2 in which output current IR1 of voltage conversion circuit 12 based on output BIASL1 of constant voltage source circuit 12 can be monitored. In FIG. 12, the second test mode is set by setting adjustment test signals TMTUNE1 at "L" and TMTUNE2 at "H".

The outline of the adjustment sequence using these test modes is as follows. It is assumed that temperature is Tb.

<1> Voltage source circuit 12 enters test mode TM1, and output BIASS of output voltage generation circuit 61 is measured and, indirectly, a current Itmr is measured.

Alternatively, oscillation frequency RCYC of the refresh timer may be measured through basic ring oscillator 3 operating in response to output BIASS as described in the second embodiment.

It is assumed that current IR0 is made equal to input current IL1 of voltage conversion circuit 12 and that current Itmr is a value obtained by multiplying input current IL1 by mirror ratio WR0/WL0 (the gate width ratio of P-type MOS transistors MP14 and MP15 shown in FIG. 12).

<2> Voltage source circuit 12 leaves test mode TM1.

<3> Voltage source circuit 12 enters test mode TM2, and output BIASS of output voltage generation circuit 61 is measured and, indirectly, current Itmr is measured.

Similarly to <1>, oscillation frequency RCYC of the refresh timer may be measured.

Similarly to <1>, current Itmr is a value obtained by multiplying input current IR1 by mirror ratio WR0/WL0.

<4> When the above-described condition of IR1(Tb)=IL1(Tb) is set, variable resistance Z1 of voltage conversion circuits 12 and 13 is adjusted so as to be equal or closest to the result of <1> based on the result of <3>.

As described above, by adjusting the resistance value of the resistance included in voltage conversion circuit 12, it is possible to provide a voltage source circuit having stable temperature characteristic without the influence of process irregularities.

In this embodiment, an example in which only the first stage of voltage conversion circuit 12 employs the variable resistance has been described. Alternatively, the second voltage conversion circuit stage may also employ a variable resistance.

Further, according to this embodiment, since one output voltage generation circuit can check the output voltages of a plurality of voltage conversion circuits using the adjustment test signals serving as select signals, it is unnecessary to provide output voltage generation circuits for the respective voltage conversion circuits for tests.

That is, the output voltage generation circuit can monitor not only the output of the final voltage conversion circuit stage of a plurality of cascaded voltage conversion circuit stages but also the outputs of the other stages.

Sixth Embodiment

The adjustment mechanism shown in FIG. 13 is advantageously simple and easily adopted. However, it is required to estimate the change of current IR1 (which is also the output current of the first stage of voltage conversion circuit 12) corresponding to a combination of R0 to R3 somehow or other so as to determine a final combination.

In this embodiment, tuning (hereinafter, referred to as "pseudo-tuning") which enable measuring the change of current IR1 corresponding to the combination of resistances R0 to R3 is performed, whereby a configuration in which fuses can be blown is shown based on the result of tuning.

Figure 14:
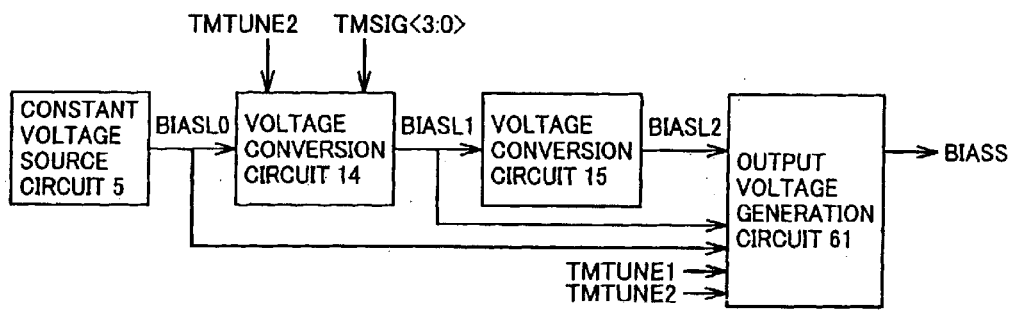
FIG. 14 is a block diagram of a voltage source circuit according to a sixth embodiment of the present invention.

FIG. 14 shows a voltage source circuit 23 capable of adjusting the temperature characteristics of the voltage conversion circuits in this embodiment.

Referring to FIG. 14, voltage source circuit 23 in this embodiment differs from voltage source circuit 22 shown in FIG. 11 in that signal TMTUNE2 and pseudo-tuning code signals TMSIG<3>, TMSIG<2>, TMSIG<1> and TMSIG<0> (hereinafter, generically referred to as "TMSIG<3:0>") are inputted to the first stage of a voltage conversion circuit 14.

It is noted that the second stage of a voltage conversion circuit 15 is equal to voltage conversion circuit 1 shown in FIG. 1.

Figure 15:
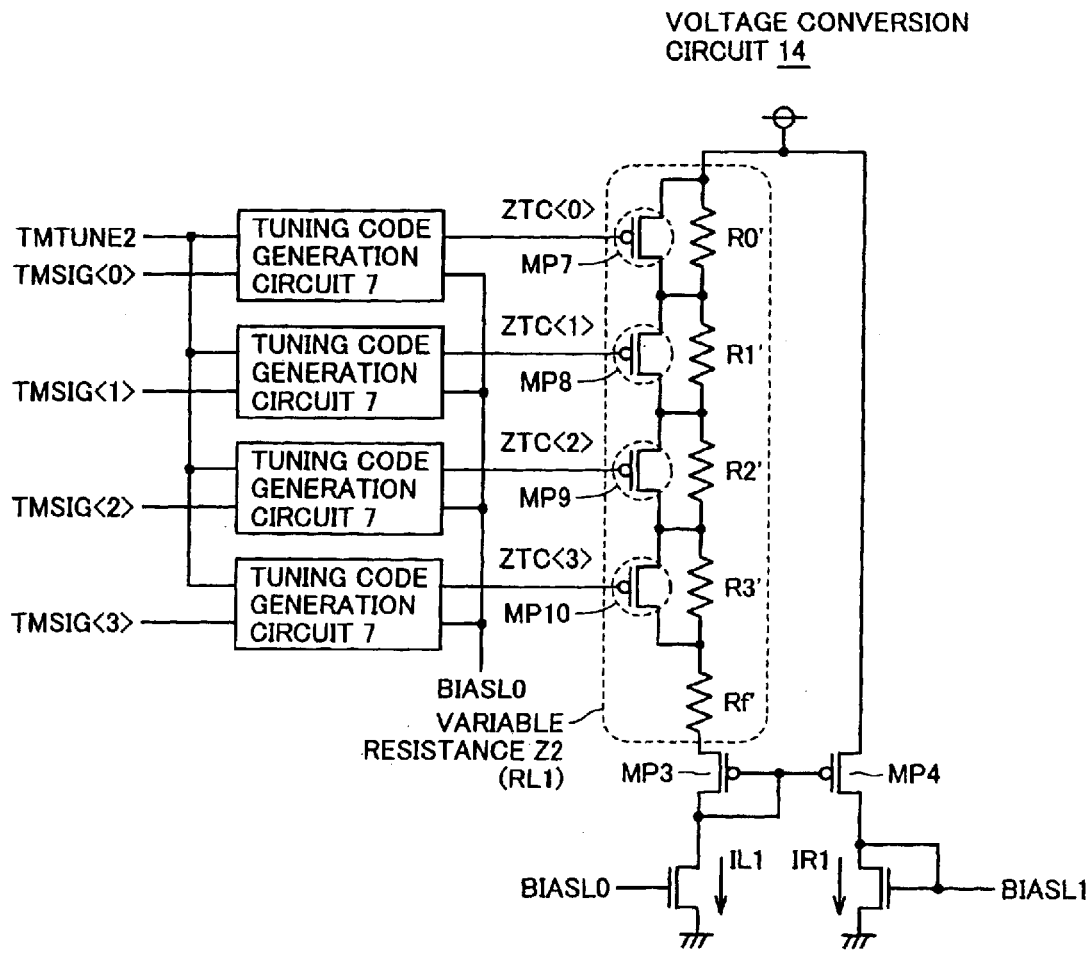
FIG. 15 is a circuit diagram of a voltage conversion circuit according to the sixth embodiment of the present invention.

The configuration of voltage conversion circuit 14 shown in FIG. 15 corresponds to that of voltage conversion circuit 12 shown in FIG. 13, i.e., a variable resistance Z2 is formed of four adjustment resistances (resistance values R0' to R3') having P-type MOS transistors MP7 to MP10 arranged in parallel and one fixed resistance (resistance value Rf).

The gates of transistors MP7 to MP10 receive output ZTC<3:0> of tuning code generation circuits 7, respectively.

Figure 16:
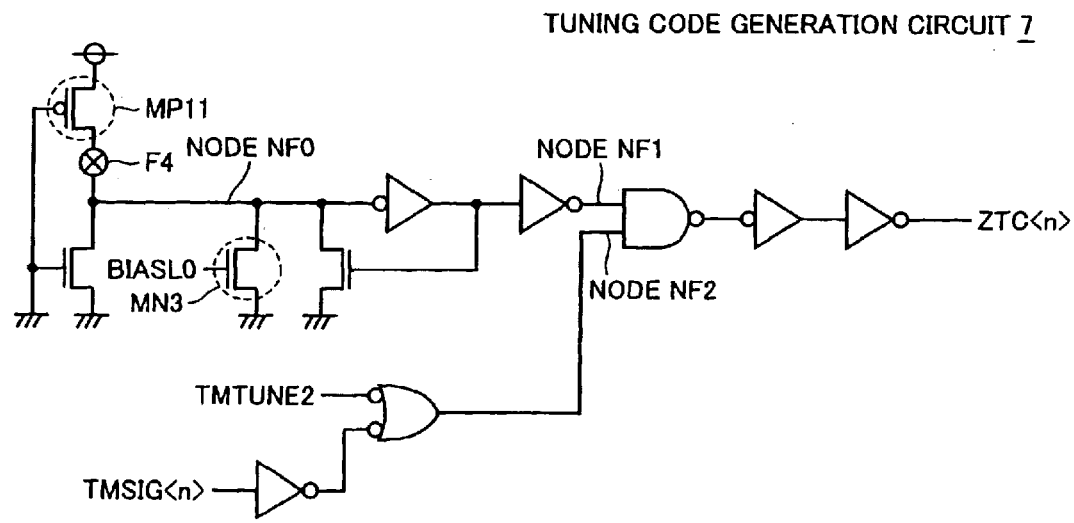
FIG. 16 is a circuit diagram of a tuning code generation circuit according to the sixth embodiment of the present invention.

Referring to FIG. 16, in each tuning code generation circuit 7, a P-type MOS transistor MP11 is set to have a higher driving capability than that of an N-type MOS transistor MN3.

Here, MN3 receives output BIASL0 of constant voltage source circuit 5 and a drain current is limited.

Due to this, in a normal operation in which no pseudo-tuning is performed, signal TUTUNE2 is set at "L", a node NF2 is set at "H". When fuse F4 shown in FIG. 16 is not blown, nodes NF0 and NF1 are at "H" and an output ZTC<n> is at "L".

Conversely, when fuse F4 is blown, nodes NF0 and NF1 are at "L" and output ZTC<n> is at "H".

When pseudo-tuning is performed, signal TMTUNE2 is set at "H", whereby output ZTC<n> is determined according to pseudo-tuning code signal TMSIG<n> for adjustment.

The configuration of tuning code generation circuit 7 will be described in more detail.

Since a fuse blowing step is not executed yet, node NF1 is at "H".

When signal TMSIG<n> is set at "L", then output ZTC<n> is set at "H", the corresponding P-type MOS transistor which is shown in FIG. 15 and the gate of which receives ZTC<n> is turned off and the corresponding resistance are used.

On the other hands, when signal TMSIG<n> is set at "H", then output ZTC<n> is set at "L", the corresponding P-type MOS transistor the gate of which receives ZTC<n> is turned on and the both ends of the corresponding resistance short-circuited. Namely, the resistance is not used.

Next, the resistance value adjustment sequence of voltage conversion circuit 14 in this embodiment will be described.

<1> Voltage conversion circuit 14 enters test mode TM1 and output BIASS of output voltage generation circuit 61 is measured and, indirectly, current Itmr is measured.

Alternatively, as described above, oscillation frequency RCYC of the refresh timer described in the second embodiment may be measured.

It is assumed that current IR0 is made equal to input current IL1 of voltage conversion circuit 12 and that current Itmr is a value obtained by multiplying input current IL1 by mirror ratio WR0/WL0 (the gate width ratio of P-type MOS transistors MP14 and MP15 shown in FIG. 12).

<2> Voltage conversion circuit 14 leaves test mode TM1.

<3> Voltage conversion circuit 14 enters test mode TM2.

<4> Output BIASS of output voltage generation circuit 61 for all or part of the combination of TMSIG<3:0> is measured and, indirectly, current Itmr is measured.

Similarly to <1>, oscillation frequency RCYC of the refresh timer may be measured.

Current Itmr is a value obtained by multiplying output current IR1 of voltage conversion circuit 14 by the same mirror ratio as that described in <1>.

<5> Pseudo-tuning code signals TMSIG<3:0> equal to or closest to the result of <1> are determined based on the result of <4>.

Steps <3> to <5> in the resistance value adjustment sequence described above are for pseudo-tuning. By performing this pseudo-tuning, it is possible to obtain a combination of TMSIG<3:0> for realizing the most ideal resistance values.

Next, it is necessary to relate this combination with actual fuse blowing information.

Referring to FIG. 16, in the normal mode (TMTUNE2="L"), ZTC is at "H" when fuses are blown and ZTC is at "L" when fuses are not blown.

Therefore, considering the relationship between TMSIG and ZTC when TMTUNE2 is at "H" already described above, it is understood from the above-described resistance value adjustment that fuses should be blown when TMSIG<n> is at "L" and may not be blown when TMSIG<n> is at "H".

As can be seen, with the configurations shown in FIGS. 14 to 16, output BIASS of output generation circuit 61 can be measured by switching the resistance value of the variable resistance provided in voltage conversion circuit 14 in a pseudo manner, so that it is possible to determine the final fuse blowing information more accurately.

In this embodiment, the first stage of voltage conversion circuit 14 is constituted so that the resistance value can be adjusted. As shown in FIG. 14, alternatively, not the first stage but the second stage of voltage conversion circuit 15 may be constituted so that the resistance value can be adjusted.

Further, both the first and second stages of voltage conversion circuits may be constituted so that the resistance values can be adjusted. By so forming, it is possible to make finer adjustment.

However, there are cases where the resistance value can be sufficiently adjusted only by so forming one of the voltage conversion circuit stages.

Furthermore, there are cases where when many adjustment parts are provided, the circuit becomes disadvantageously complicated and large in area.

In these cases, one of the voltage conversion circuits has a variable resistance. The voltage conversion circuit is preferably the voltage conversion circuit which inputs the output of constant voltage source circuit 2, i.e., voltage conversion circuit 14 in this embodiment.

The reason is as follows. The adjustment tends to be easier when the resistance value is adjusted in the first voltage conversion circuit stage before the irregularities are amplified than the resistance value is adjusted in the second stage after great irregularities in the first stage are amplified.

Seventh Embodiment

In the fifth embodiment, the temperature characteristic is adjusted by adjusting the resistance value of the resistance provided in the voltage conversion circuit.

In this embodiment, not the voltage conversion circuit but input BIASL0 of the first voltage conversion circuit stage is adjusted so that multiplication factor $\alpha$ becomes 1 at temperature Tb.

Figure 17:
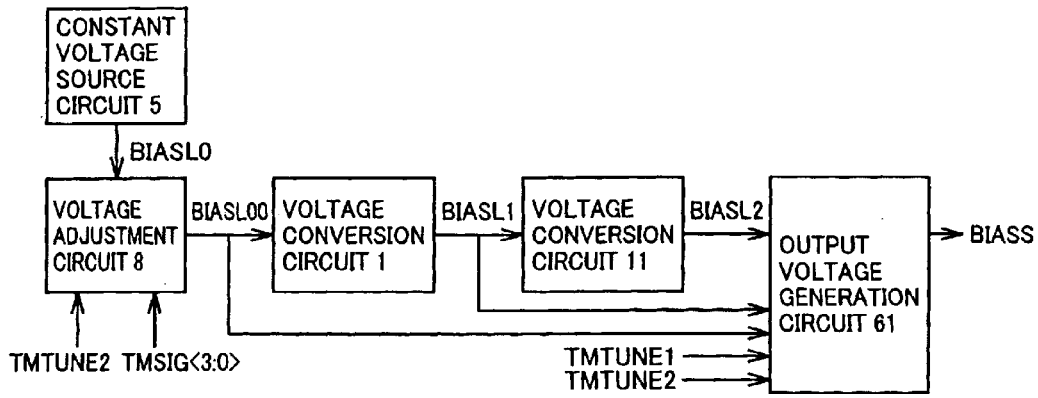
FIG. 17 is a block diagram of a voltage source circuit according to a seventh embodiment of the present invention.

Referring to FIG. 17, a voltage source circuit 24 in the seventh embodiment is characterized in that a voltage adjustment circuit 8 is provided between constant voltage source circuit 5 and voltage conversion circuit 1.

In the preceding embodiments, it is assumed that output current IR0 of constant voltage source circuit 5 is equal to input current IL1 of voltage conversion circuit 1. In this embodiment, by inserting voltage adjustment circuit 8, output current IR0 of constant voltage source circuit 5 is not always equal to input current IL1 of voltage conversion circuit 1.

Voltage conversion circuit 1 is equal in configuration to that shown in FIG. 1 except that the input of circuit 1 is replaced from BIASL0 to BIASL00.

Figure 18:
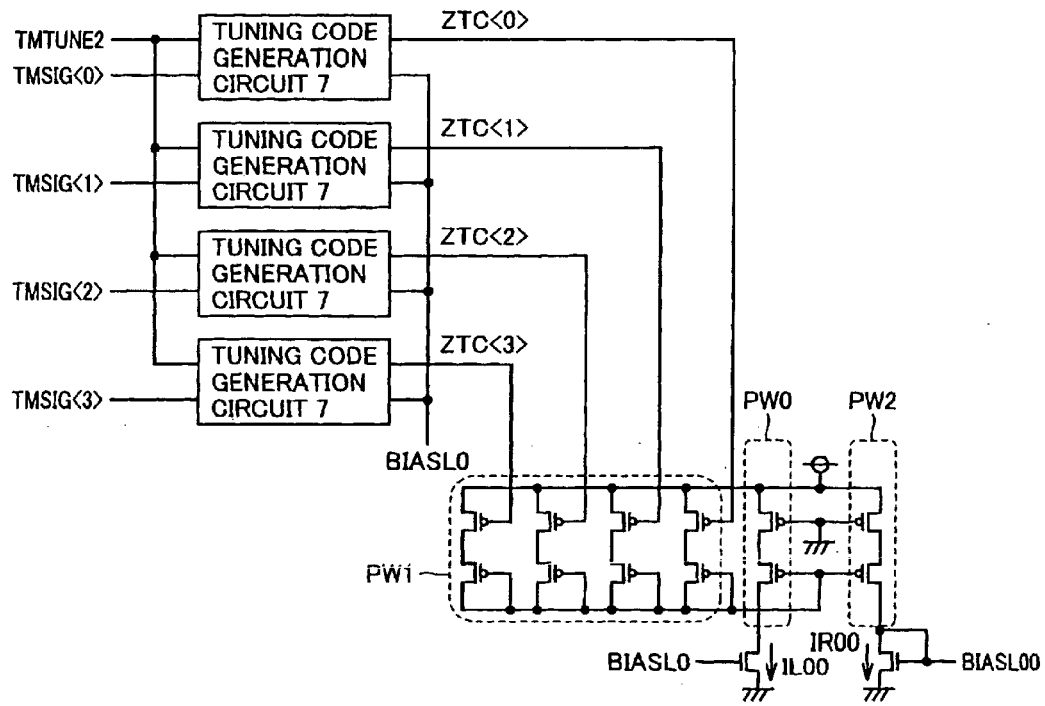
FIG. 18 is a circuit diagram of a constant voltage source circuit according to the seventh embodiment of the present invention.

Referring to FIG. 18, in which the configuration of voltage adjustment circuit 8 is shown, when ZTC<n> is inactive, an input current IL00 is determined by a P-type MOS transistor group PW0 and when one ZTC<n> is activated, one transistor of a P-type MOS transistor group PW1 consisting of transistors having different gate widths is activated, whereby the gate width of the P-type MOS transistor is adjusted to make input current IL00 adjustable.

As can be seen, by adjusting the mirror ratio of voltage adjustment circuit 8 (the ratio of the sum of the gate widths of activated PW1 and PW0 to the gate width of PW2), output current IR00 and output BIASL00 are determined.

The adjustment method in this embodiment is the same pseudo-tuning method as that described in the eighth embodiment and the adjustment sequence is the same as that described in the eighth embodiment, as well.

In step <4> of the adjustment sequence shown in the sixth embodiment, in particular, pseudo-tuning code signals TMSIG<3:0> are sequentially changed and the mirror ratio of the input and output currents of voltage adjustment circuit 8 is changed to thereby obtain a mirror ratio under the condition that multiplication factor $\alpha$ becomes closest 1 at temperature Tb, i.e., the difference between IL1(Tb) and IR1(Tb) is minimized.

As described above, by adjusting the input of the voltage conversion circuit, it is possible to provide a voltage source circuit having stable temperature characteristic without the influence of process irregularities.

Eighth Embodiment

In the fifth to sixth embodiments, a case where the temperature characteristic of the voltage conversion circuit can be adjusted relative to processing irregularities has been described.

Normally, there is no correlation between the materials and the irregularities of the temperature characteristic of the resistance.

Therefore, when the resistance material of the resistance employed in the respective cascaded voltage conversion circuits differ, the temperature characteristic of the voltage conversion circuits cannot be managed to be a predetermined value as a whole without providing any adjustment mechanism for each resistance material.

When some resistance material is used in the constant voltage source circuit, it is also necessary to consider the resistance materials including that in the constant voltage source circuit.

Furthermore, since the adjustment mechanism adjusting the resistance value causes an increase in layout area, it is desirable that each adjustment target resistance is as low as possible.

Taking the above into consideration, this embodiment is provided.

Two types of resistance materials (A and B) are used in the constant voltage source circuit and the voltage conversion circuits. Among the circuits, only one voltage conversion circuit that uses resistance material A is employed and provided with a resistance adjustment mechanism while the constant voltage source circuit and the other voltage conversion circuit(s) use resistance material B.

When the absolute value of resistance material A is determined according to the relationship with the absolute value of resistance material B of the constant voltage source circuit, then the relationship with the absolute value of resistance material B included in each of all the other voltage conversion circuits is automatically determined.

Figure 19:
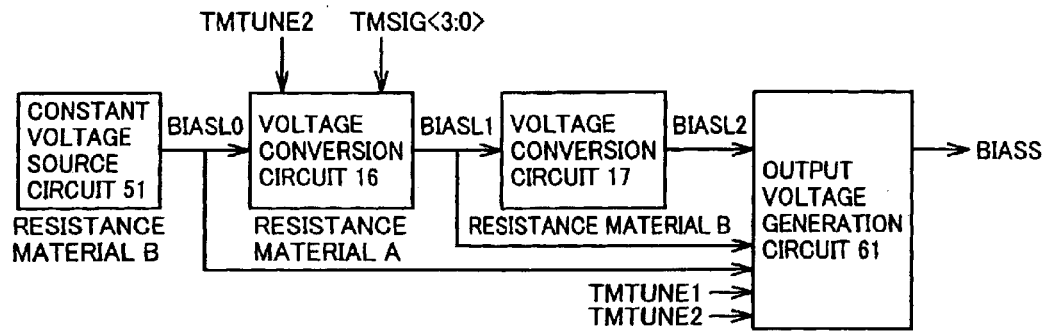
FIG. 19 is a block diagram of a voltage source circuit according to an eighth embodiment of the present invention.

Referring to FIG. 19, which is a block diagram of a voltage source circuit 25 which embodies the above-described configuration, a constant voltage source circuit 51 and the second stage of a voltage conversion circuit 17 use resistance material B for resistances included therein. For brevity of description, it is assumed that the number of voltage conversion circuit stages is two.

Since constant voltage source circuit 51 and voltage conversion circuit 17 use the same resistance material, the resistance values thereof tend not to be greatly different, as compared with different resistance materials are used.

Further, the first stage of a voltage conversion circuit 16 uses resistance material A and includes a pseudo-tuning mechanism.

The second stage of voltage conversion circuit 17 is equal in configuration to voltage conversion circuit 1 shown in FIG. 1 except that resistance X is made of resistance material B.

Figure 20:
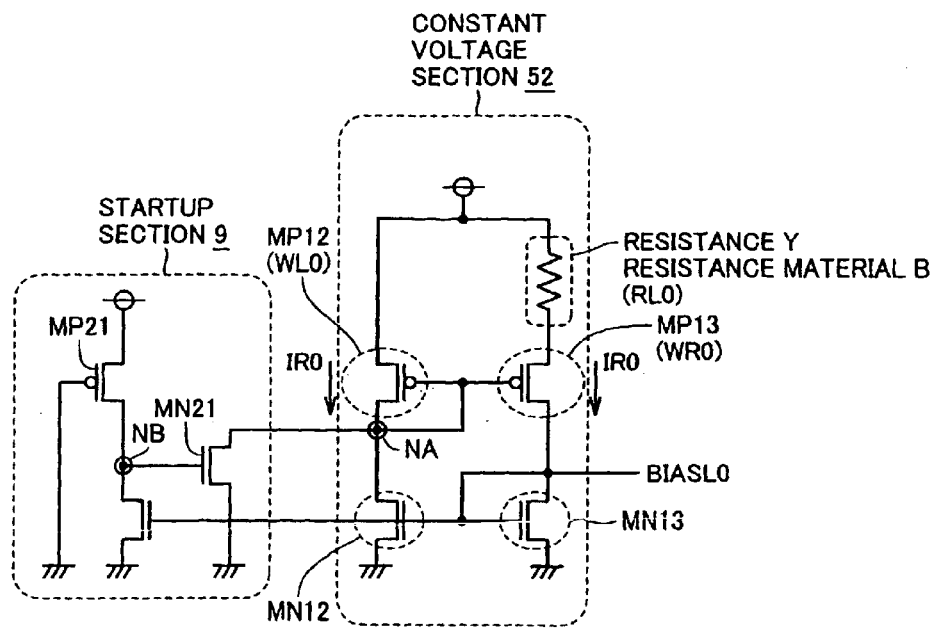
FIG. 20 is a circuit diagram of a constant voltage source circuit according to the eighth embodiment of the present invention.

Referring next to FIG. 20, constant voltage source circuit 51 in this embodiment is formed of a constant voltage section 52 and a startup section 9.

Constant voltage section 52 is equal to constant voltage source circuit 5 shown in FIG. 6 except that a resistance Y is made of resistance material B.

Startup section 9 is provided to be able to set the node NA of constant voltage section 52 at an operational stable point when power is turned on.

To be specific, when power is turned on, the potential of a node NB is raised by a P-type MOS transistor MP21. Accordingly, N-type MOS transistor MN21 is turned on to thereby lower the potential of node NA.

When a power supply voltage is raised and the voltage becomes stably constant, then the voltage of node NB becomes not more than a threshold voltage and N-type MOS transistor MN21 is turned off to thereby stable the potential of node NA.

Next, the configuration of voltage source circuit 25 shown in FIG. 19 that is excellent in suppressing irregularities will be described based on mathematical expressions.

Output current IR0 of constant voltage source circuit 51 shown in FIG. 20 and the temperature change quantity of output current IR0 are obtained first.

When the mirror ratio of a current-mirror consisting of N-type MOS transistors NM12 and NM13 shown in FIG. 20 is 1:1, current IR0 is carried to P-type MOS transistors MP12 and MP13.

It is assumed herein that the channel widths of P-type MOS transistors MP12 and MP13 are WL0 and WR0 (WL0<WR0) and that the channel lengths thereof are equal.

When the same relational expressions as expressions (1) and (2) are established to obtain IR0, the following relationship is satisfied.

$$IR0 = S \times \log(WR0/WL0)/RL0 \quad (10)$$

Further, the temperature change quantity $\Delta IR0$ of IR0 is assumed to be $IR0(Tb)/IR0(Ta)$ ($\Delta IR0 = IR0(Tb)/IR0(Ta)$), the following equation is deduced from expression (10).

$$\Delta IR0 = \Delta S/\Delta RL0 \quad (11)$$

Next, output current IR1 of voltage conversion circuit 16 shown in FIG. 19 and the temperature change quantity of IR1 are obtained.

When it is assumed that output current IR0 of constant voltage source circuit 51 is equal to input current IL1 of voltage conversion circuit 16 and expression (4) is assigned to expression (10), the following relationship is satisfied.

$$IR1 = (WR1/WL1) \times IR0 \times (WR0/WL0)^{(RL1/RL0)} \quad (12)$$

Further, when it is assumed that WR1/WL1=WR0/WR0, the following relationship is deduced from expression (12).

$$IR1 = IR0 \times (WR0/WL0)^{((RL1/RL0)-1)} \quad (13)$$

Temperature change quantity $\Delta IR1$ of output current IR1 is then obtained.

Since IR0=IL1, $\Delta IR0 = \Delta IL0$.

When the above relationship and expression (11) are assigned to expression (5) about temperature change quantity $\Delta IR1$ of IR1, the following expression is obtained.

$$\Delta IR1 = \Delta IR0 * 10^{[\alpha * \{1 - \Delta RL0/\Delta RL1\}]} \quad (14)$$

As for amplification factor $\alpha$, expression (4) is assigned to expression (6) while considering that IR0=IL0, the following expression is obtained.

$$\alpha = \log(WR0/WL0) * \{RL1(Tb)/RL0(Tb)\} \quad (15)$$

When it is assumed herein that RL1(Tb)=RL0(Tb) at temperature Tb, the following expression is obtained.

$$\alpha = \log(WR0/WL0) \quad (16)$$

When expression (16) is assigned to expression (14), the following expression is obtained.

$$\Delta IR1 = \Delta IR0 * (WR0/WL0)^{\{1 - \Delta RL0/\Delta RL1\}} \quad (17)$$

Expression (17) demonstrates that $\Delta IR0$, $\Delta RL0$ and $\Delta RL1$ are temperature constants determined by the resistance materials and it is, therefore, unnecessary to consider manufacturing irregularities.

In other words, by adjusting the resistance values so as to satisfy RL1(Tb)=RL0(Tb) at temperature Tb as assumed above, it is possible to obtain the constant temperature change quantity of the output current from voltage conversion circuit 16.

In this embodiment, it suffices that the resistance value of resistance X of voltage conversion circuit 16 is set equal to that of resistance Y of constant voltage source circuit 51.

Likewise, output current IR2 of voltage conversion circuit 17 shown in FIG. 19 and the temperature change quantity of IR2 are obtained.

It is assumed herein that the input current of voltage conversion circuit 17 is IL2 and that the amplification factor of resistance material B used for the resistance of voltage conversion circuit 17 is $\beta$.

Under these conditions, amplification factor $\beta$ is given by the following expression similarly to expression (6).

$$\beta = IL2(Tb) \times RL2(Tb)/S(Tb) \quad (18)$$

Further, when it is assumed that IR0=IR1=IL2 at temperature Tb and S in expression (10) is assigned to expression (18), the following expression is obtained.

$$\beta = IL0(Tb) \times RL2(Tb)/S(Tb) = \log(WR0/WL0) \times \{RL2(Tb)/RL0(Tb)\} \quad (19)$$

In addition, $\Delta IR2$ is given by the following expression similarly to expression (5).

$$\Delta IR2 = \Delta IL2 \times 10^{[\beta \times \{1 - \Delta S/(\Delta IL2 \times \Delta RL2)\}]} \quad (20)$$

Amplification factor β includes a term RL2(Tb)/RL0(Tb) included in expression (20) and in which the only absolute resistance value is shown.

However, since RL0 and RL2 are made of same resistance material B, the ratio thereof can be suppressed within irregularities in material.

Namely, the temperature change of output current IR2 of voltage conversion circuit 17 can be suppressed within irregularities of resistance material B.

As described above, since the irregularities between the resistances made of the same resistance material are small, the mechanism which corrects the process irregularities of the absolute value of resistance material B is less needed than a case of the resistance made of resistance material A.

Thus, the temperature change quantity of the output current of voltage conversion circuit 17 is obtained as described above. Therefore, even when the configuration shown in FIG. 19 is expanded to cascade voltage conversion circuits including a voltage conversion circuit using resistance material B, the temperature characteristics of the voltage conversion circuits merely depend on the ratio of the resistance value to RL0(Tb) in each voltage conversion circuit at temperature Tb and the adjustment mechanism is less needed in the voltage conversion circuit including the resistance made of resistance material B.

As described above, the number of resistance materials used in the voltage conversion circuits in the voltage source circuit is limited to two or less and the constant voltage source circuit and the voltage conversion circuits uses a common resistance material for the respective resistances, whereby it is possible to realize the configuration in which the adjustment mechanism is simplified.

In this embodiment, an example in which the first and second voltage conversion circuit stages use different resistance materials A and B, respectively, has been described. Alternatively, the constant voltage source circuit and the first and second voltage conversion circuit stages may use the same resistance material for the respective resistances.

Further, in this embodiment, a combination of constant voltage source circuit 51 shown in FIG. 20 and voltage conversion circuit 1 shown in FIG. 1 or the like exhibit a special advantage.

In FIGS. 20, 1 and the like, P-type MOS transistors operate in the sub-threshold region.

Due to this, the S factor dependencies of the respective circuits cancel one another, so that the dependency of the S factors on process irregularities is advantageously relaxed.

Specifically, ΔS is included in the characteristic of the power of 10 in the temperature change quantity of the output current of the voltage conversion circuit as shown in expression (5). When the voltage conversion circuit is combined with the constant voltage source circuit shown in FIG. 20, ΔS and ΔS dependency in the front part satisfactorily cancel each other and the characteristic does not depend on ΔS.

Furthermore, the constant voltage source circuit and the voltage conversion circuit are similar in circuit configuration, so that it is possible to use a common layout pattern for the circuits and suppress manufacturing irregularities.

Specifically, the layout pattern of voltage conversion circuit 1 shown in FIG. 10 corresponds to that of constant voltage source circuit 51 and the layout pattern of voltage conversion circuit 11 corresponds to that of voltage conversion circuit 17.

As for the resistances, it suffices to set W1 equal to W2, S1 equal to S2 and L1 equal to L2 in the resistance patterns.

When some of them are to be set equal, it is most preferable to set the pattern widths, i.e., active region widths equal.

It is also considered that the widths vary by about 10% due to irregularities or the like.

The number of zigzag patterns forming the resistance can be set different between constant voltage source circuit 51 and voltage conversion circuit 11.

It is also preferable that the transistor patterns of the respective circuits conform to each other as shown in FIG. 10.

The sizes such as the gate widths of the transistors may differ between the circuits. However, by assuming that basic pattern TAB of the transistors shown in FIG. 10 is one unit and arranging them in parallel to form a transistor having a large gate width, it is possible to suppress the irregularities between the transistor having a large gate width and the transistor having a small gate width.

By setting the directions of the respective patterns equal between the circuits, it is possible to prevent the occurrence of the irregularities of resistance values due to the asymmetry of the active regions resulting from the ion injection angle.

In this embodiment, an example of making the patterns of constant voltage source circuit 51 and voltage conversion circuit 17 equal has been described. It is preferable to set the pattern of voltage conversion circuit 16 shown in, for example, FIG. 19, equal to those of constant voltage source circuit 51 and voltage conversion circuit 17.

That is, by setting the patterns of the respective stages equal, it is possible to more resist manufacturing irregularities.

The setting of transistor patterns equal described in this embodiment is also applicable to the other embodiments.

When the circuit configurations shown in the fourth embodiment are equal among the stages, it is particularly excellent in suppressing irregularities.

Ninth Embodiment

As described in the third embodiment and the like, it is possible to generate a voltage and a current each having a large temperature change quantity by cascading a plurality of voltage conversion circuits.

In the ninth embodiment, an output branched in the course of cascade connection is used, whereby it is possible to selectively use voltages and currents having a plurality of different temperature change quantities.

Figure 21:
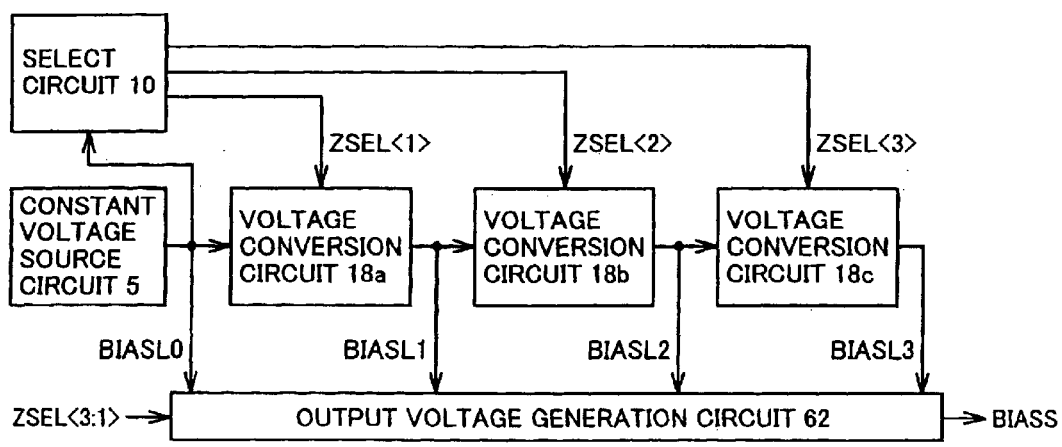
FIG. 21 is a block diagram of a voltage source circuit according to a ninth embodiment of the present invention.

Referring to FIG. 21, a voltage source circuit 26 in this embodiment is constituted, for example, that three voltage conversion circuits 18a to 18c are cascaded.

The configuration of voltage source circuit 26 shown in FIG. 21 differs from those of the voltage source circuits described above in that respective outputs BIASL0 to BIASL3 of constant voltage source circuit 5 and three voltage conversion circuits 18a to 18c are inputted to an output voltage generation circuit 62 and in that a select circuit 10 which selects whether to output BIASL0 to BIASL3 from the respective circuits is provided.

Figure 22:
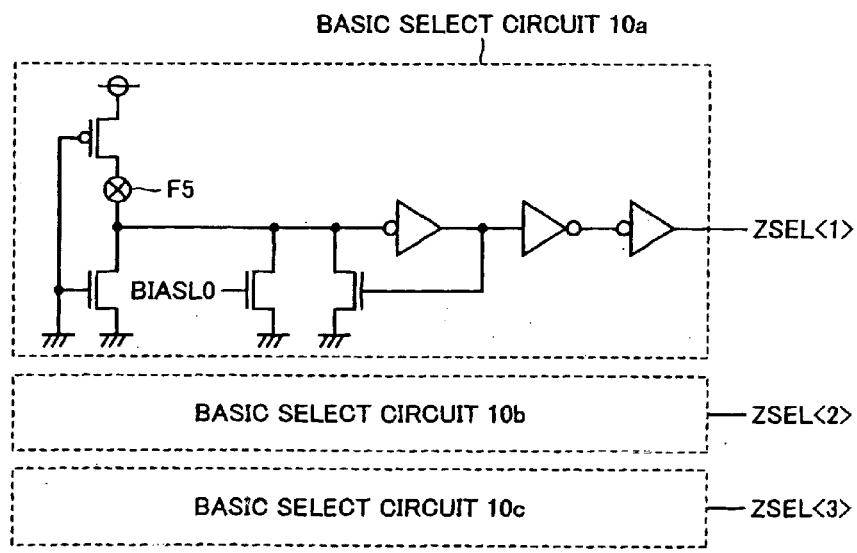
FIG. 22 is a circuit diagram of a select circuit according to the ninth embodiment of the present invention.

Referring to FIG. 22, select circuit 10 is formed of basic select circuits 10a to 10c corresponding to select signals ZSEL<1> to <3>, respectively.

Basic select circuits 10a to 10c are similar in configuration to tuning code generation circuit 7 shown in FIG. 16.

When fuse F5 is not blown, select signal ZSEL<n> is at "L" and the corresponding voltage conversion circuit is activated. When fuse F5 is blown, select signal ZSEL<n> is at "H" and the corresponding voltage conversion circuit is deactivated.

The correspondence of the selection of BIASL0 to BIASL3 to be input to output voltage generation circuit 62 and select signals is as follows.

Select BIASL0: ZSEL<1>="H", ZSEL<2>="H" and ZSEL<3>="H"

Select BIASL1: ZSEL<1>="L", ZSEL<2>="H" and ZSEL<3>="H"

Select BIASL2: ZSEL<1>="L", ZSEL<2>="L" and ZSEL<3>="H"

Select BIASL3: ZSEL<1>="L", ZSEL<2>="L" and ZSEL<3>="L"

Figure 23:
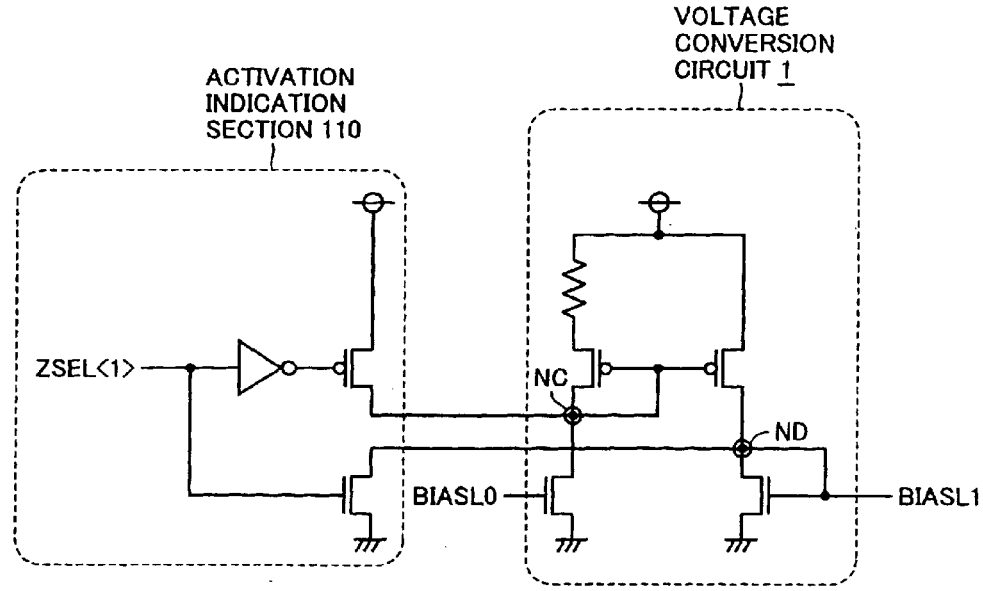
FIG. 23 is a circuit diagram of a voltage conversion circuit according to the ninth embodiment of the present invention.

Referring to FIG. 23, voltage conversion circuit 18a in this embodiment differs from voltage conversion circuit 1 shown in FIG. 1 in that an activation indication section 110 which receives the output of ZSEL<1> and determines whether to activate or deactivate the circuit is added.

ZSEL<1> is input to activation indication section 110 and voltage conversion circuit 1 is controlled.

When ZSEL<1> is at "H", then the voltage of a node NC is fixed to a power supply voltage and that of a node ND is fixed to a ground voltage and output BIASL1 becomes "L".

When ZSEL<1> is at "L", nodes NC and ND are electrically disconnected from activation indication section 110 and the voltage is determined according to the operation of voltage conversion circuit 18a.

It is noted that voltage conversion circuits 18b and 18c are equal in configuration to voltage conversion circuit 18a.

Figure 24:
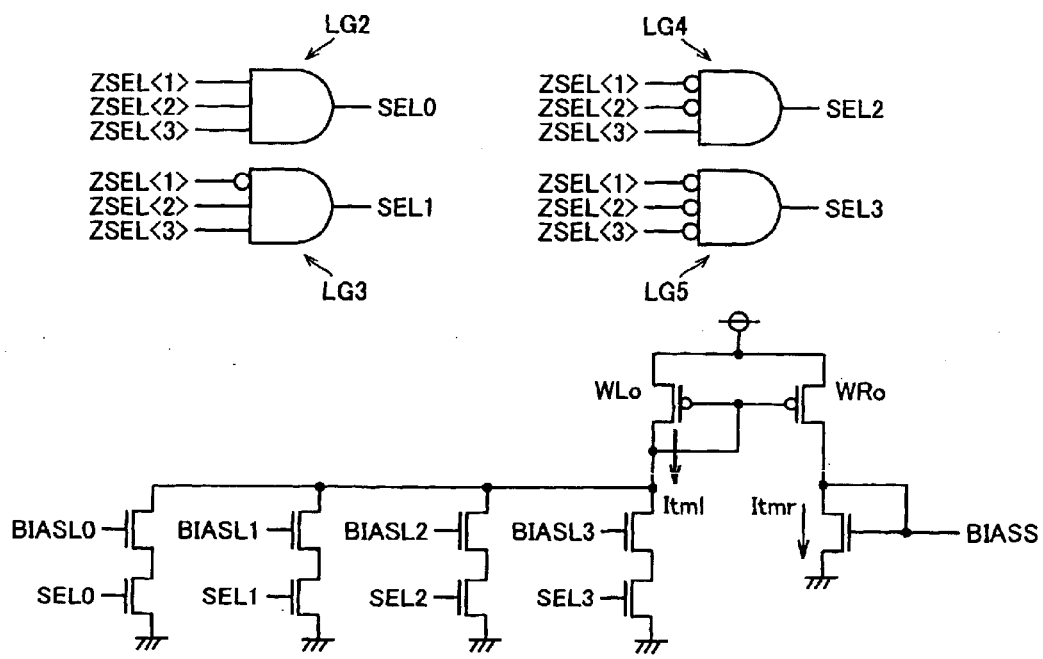
FIG. 24 is a circuit diagram of an output voltage generation circuit according to the ninth embodiment of the present invention.

Referring to FIG. 24, output voltage generation circuit 62 in this embodiment is constituted so that each of logic circuits LG2 to LG5 generates a signal SELm (m=0 to 3) for selecting a predetermined output BIASLm in accordance with the correspondence between BIASL0 to BIASL3 and ZSEL<1> to ZSEL<3> described above.

The branch of BIASLm corresponding to SELm is selected and input current Itml of the circuit is determined.

A current obtained by multiplying input current Itml by mirror ratio WRo/WLo becomes output current Itmr and supplied, as output voltage BIASS, to the outside of the circuit.

As can be seen, one of the outputs of the constant voltage source circuit and the voltage conversion circuits that are cascaded is selected according to select signals, and the output voltage generation circuit generates an output voltage according to the selected output. Therefore, the voltage source circuit can select the voltage having the most appropriate characteristic from among a plurality of voltages having different temperature change quantities and supply the selected voltage to the outside of the circuit.

That is, the output voltage generation circuit can utilize not only the output of the final stage of a plurality of cascaded voltage conversion circuit stages but also the outputs of the stages other than the final stage.

Tenth Embodiment

In the first to eighth embodiments, the voltage conversion circuit having the resistance provided between the source of P-type MOS transistor MP1 and the Vcc line has been described.

Figure 25:
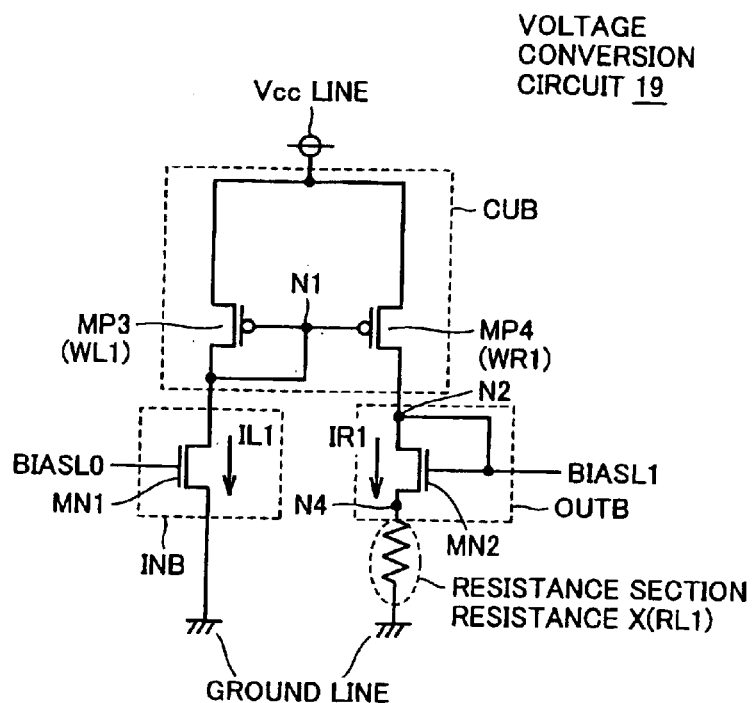
FIG. 25 is a circuit diagram of a voltage conversion circuit according to a tenth embodiment of the present invention.

As shown in FIG. 25, a voltage conversion circuit 19 having resistance X provided between a node N4 connected to the source of N-type MOS transistor MN2 and a ground line may be used.

That is, as shown in FIG. 25, a resistance section may be provided not between the Vcc line and a current-mirror section CUB but between an output section OUTB and the ground line.

In this case, N-type MOS transistors MN1 and MN2 operate in a sub-threshold region.

In addition, S factors for temperature characteristics are determined not by the P-type MOS transistors but by the N-type MOS transistors.

Normally, the S factor of an N-type MOS transistor is smaller than that of a P-type MOS transistor. When the resistances are equal, it is possible to increase the temperature change quantity of an output current or the like.

Besides voltage conversion circuit 19 shown in FIG. 25, the constant voltage source circuit may be realized by connecting the resistance to the source of the N-type MOS transistor.

In the embodiments described thus far, an example of MOS transistors has been described. Alternatively, MIS (Metal-Insulator-Semiconductor) transistors may be similarly used.

In the embodiments described thus far, an example in which the drain of P-type MOS transistor MP1 is directly connected to the drain of N-type MOS transistor MN1 and the drain of P-type MOS transistor MP2 is directly connected to the drain of N-type MOS transistor MN2 shown in FIG. 1 has been described. Alternatively, by the adjustment of the operation and the like, MIS transistors may be additionally provided between them, respectively.

Further, bipolar transistors may be used in place of MIS transistors. In this case, N-type MIS transistors are replaced by NPN bipolar transistors and P-type MIS transistors are replaced by PNP bipolar transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a voltage conversion circuit for converting a voltage value of an input voltage according to temperature change and outputting an output voltage, wherein said voltage conversion circuit includes:

an input section having a first transistor connected between a first voltage line and a first node, and carrying an input current by applying said input voltage to said first transistor;

a current-mirror section having a second transistor connected between said first node and a second voltage line supplying a different voltage from a voltage supplied by said first voltage line, and a third transistor connected between a second node, to which an output current according to said input current is carried, and said second voltage line, and forming a current-mirror by said second and third transistors;

an output section having a fourth transistor connected between said second node and said first voltage line, and outputting said output voltage according to said output current from said second node; and a resistance section connected only one of between said second voltage line and said second transistor and between said first voltage line and said fourth transistor, and provided only as a resistance element in said voltage conversion circuit.

2. The semiconductor device according to claim 1, further comprising a plurality of said voltage conversion circuits, wherein said plurality of voltage conversion circuits is cascaded to each other to form voltage conversion circuit stages.

3. The semiconductor device according to claim 2, wherein in said voltage conversion circuit stages, said resistance sections of at least said two voltage conversion circuits are made of resistance materials different in temperature characteristic.

4. The semiconductor device according to claim 2, wherein
said resistance sections of a same resistance material in the voltage conversion circuits have patterns of an equal pattern width and lengths according to resistance values of the resistance sections.

5. The semiconductor device according to claim 2, comprising an output voltage generation circuit for selecting one of the output voltages of said voltage conversion circuit stages except for a final voltage conversion circuit stage, and capable of outputting a voltage corresponding to the selected output voltage.

6. The semiconductor device according to claim 2, comprising a constant voltage source circuit for supplying said input voltage to an initial voltage conversion circuit stage among said voltage conversion circuit stages, wherein
said input voltage is adjusted by making gate widths of transistors forming said constant voltage source circuit variable.

7. The semiconductor device according to claim 2, wherein
transistors forming equal parts of the voltage conversion circuits among said voltage conversion circuit stages are respectively formed by one of connecting a single pattern of transistors equal in gate length and gate width and connecting a plurality of patterns of transistors equal in gate length and gate width in parallel.

8. The semiconductor device according to claim 2, wherein
said resistance section of one of said voltage conversion circuit stages includes a variable resistance.

9. The semiconductor device according to claim 8, wherein
only the resistance section of an initial voltage conversion circuit stage among said voltage conversion circuit stages includes the variable resistance.

10. The semiconductor device according to claim 2, comprising a constant voltage source circuit having another resistance section, and supplying said input voltage to an initial voltage conversion circuit stage among said voltage conversion circuit stages, wherein
resistance materials of the voltage conversion circuit stages at least except for the initial voltage conversion circuit stage are equal to a resistance material of the resistance section of said constant voltage source circuit.

11. A semiconductor device comprising a plurality of voltage conversion circuits each outputting an output voltage according to an input voltage, wherein
each of said voltage conversion circuits includes:
an input section connected to a first voltage line, receiving said input voltage, and carrying an input current;
a current-mirror section connected to a second voltage line supplying a different voltage from a voltage supplied by said first voltage line, and supplying an output current according to said input current;
an output section connected to said first voltage line, and outputting said output voltage according to said output current; and
a resistance section connected one of between said current-mirror section and said second voltage line and between said output section and said first voltage line,
said plurality of voltage conversion circuits are cascaded to each other to form a plurality of voltage conversion circuit stages, and circuits elements forming said voltage conversion circuits are equal in connection relationship among the stages and said output voltage of each voltage conversion circuit stage rise or fall according to temperature rise.

12. The semiconductor device according to claim 11, wherein
in said voltage conversion circuit stages, said resistance sections of at least said two voltage conversion circuits are made of resistance materials different in temperature characteristic.

13. The semiconductor device according to claim 11, wherein
said resistance sections of a same resistance material in the voltage conversion circuits have patterns of an equal pattern width and lengths according to resistance values of the resistance sections.

14. The semiconductor device according to claim 11, comprising an output voltage generation circuit for selecting one of the output voltages of said voltage conversion circuit stages except for a final voltage conversion circuit stage, and capable of outputting a voltage corresponding to the selected output voltage.

15. The semiconductor device according to claim 11, comprising a constant voltage source circuit for supplying said input voltage to an initial voltage conversion circuit stage among said voltage conversion circuit stages, wherein
said input voltage is adjusted by making gate widths of transistors forming said constant voltage source circuit variable.

16. The semiconductor device according to claim 11, wherein
transistors forming equal parts of the voltage conversion circuits among said voltage conversion circuit stages are respectively formed by one of connecting a single pattern of transistors equal in gate length and gate width and connecting a plurality of patterns of transistors equal in gate length and gate width in parallel.

17. The semiconductor device according to claim 11, wherein
said resistance section of one of said voltage conversion circuit stages includes a variable resistance.

18. The semiconductor device according to claim 17, wherein
only the resistance section of an initial voltage conversion circuit stage among said voltage conversion circuit stages includes the variable resistance.

19. The semiconductor device according to claim 11, comprising a constant voltage source circuit having another resistance section, and supplying said input voltage to an initial voltage conversion circuit stage among said voltage conversion circuit stages, wherein
resistance materials of the voltage conversion circuit stages at least except for the initial voltage conversion circuit stage are equal to a resistance material of the resistance section of said constant voltage source circuit.

20. The semiconductor device according to claim 11, wherein
said resistance section included in each of said voltage conversion circuits is provided on only one part, and
said resistance section and other resistance sections are not included in other parts of each of said voltage conversion circuits.

* * * * *